(12) United States Patent
Ueda

(10) Patent No.: US 11,387,334 B2
(45) Date of Patent: Jul. 12, 2022

(54) SEMICONDUCTOR DEVICE WITH ELECTRODE PLATING DEPOSITION

(71) Applicant: RENESAS ELECTRONICS CORPORATION, Tokyo (JP)

(72) Inventor: Takehiro Ueda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/858,276

(22) Filed: Apr. 24, 2020

(65) Prior Publication Data

US 2021/0336017 A1 Oct. 28, 2021

(51) Int. Cl.
  *H01L 29/417* (2006.01)
  *C23C 18/16* (2006.01)
  *H01L 21/288* (2006.01)

(52) U.S. Cl.
  CPC .... *H01L 29/41725* (2013.01); *C23C 18/1642* (2013.01); *H01L 21/288* (2013.01)

(58) Field of Classification Search
  CPC ............. H01L 29/41725; H01L 21/288; C23C 18/1642
  See application file for complete search history.

(56) References Cited

U.S. PATENT DOCUMENTS

| | | | |
|---|---|---|---|
| 6,521,358 B1 * | 2/2003 | Tanaka | C23C 28/023 428/670 |
| 2013/0277841 A1 * | 10/2013 | Lii | H01L 24/16 257/741 |
| 2016/0351702 A1 | 12/2016 | Numabe et al. | |
| 2018/0102308 A1 * | 4/2018 | Nishiwaki | H01L 23/49513 |
| 2020/0152785 A1 * | 5/2020 | Ohguro | H01L 24/13 |
| 2020/0295229 A1 * | 9/2020 | Kim | H01L 33/405 |
| 2021/0242159 A1 * | 8/2021 | Teng | H01L 21/6835 |

FOREIGN PATENT DOCUMENTS

| | | |
|---|---|---|
| EP | 3 151 284 A1 | 4/2017 |
| JP | 2018-204066 A | 12/2018 |

OTHER PUBLICATIONS

Extended European Search Report issued in corresponding European Patent Application No. 21169443.5-1212, dated Sep. 17, 2021.

* cited by examiner

*Primary Examiner* — Stephen M Bradley
*Assistant Examiner* — Wasiul Haider
(74) *Attorney, Agent, or Firm* — McDermott Will & Emery LLP

(57) ABSTRACT

The semiconductor device includes a first electrode, a second electrode electrically coupled to the first electrode, and a third electrodes electrically coupled to at least one of the first and the second electrode, a first plating deposition portion on the first electrode, a second and a third plating deposition portions formed on the second and the third electrode, respectively. The areas of the second and the third plating deposition portion are smaller than the area of the first plating deposition portion. The periphery length of the third plating deposition portion is longer than the periphery length of the second plating deposition portion.

14 Claims, 21 Drawing Sheets

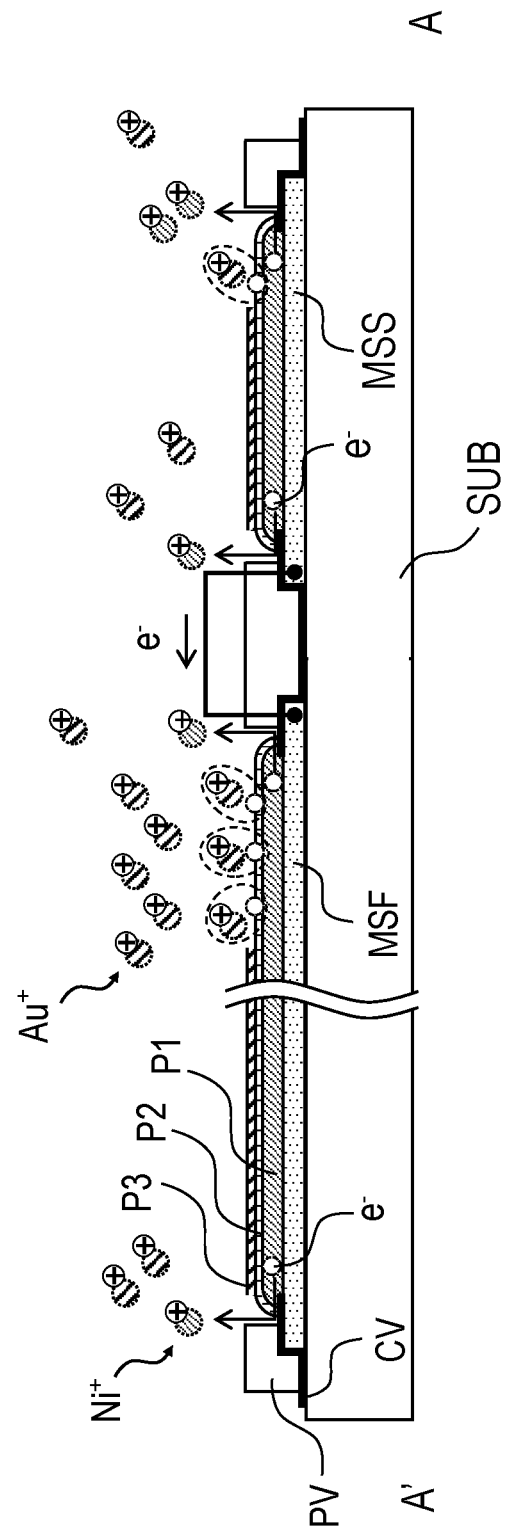

SEMICONDUCTOR DEVICE WITH ELECTRODE PLATING DEPOSITION

BACKGROUND

The present invention relates to semiconductor device, for example, to a semiconductor device having a plating deposition portion formed by using an electroless plating method.

The power semiconductor element is a semiconductor device having a source electrode formed on the main surface side, and a drain electrode formed on the back surface side. The power semiconductor element controls the current flowing between the electrode on the main surface side and the back electrode, it is utilized as a switching element which pass a large current. On the electrodes of such a power semiconductor element, mainly in order to increase the connection reliability in a configuration with a connection of a planar metal such as a clip to the source electrode, the plating deposition portion is formed.

There are disclosed techniques listed below.
[Patent Document 1] Japanese Unexamined Patent Application Publication No. 2018-204066

Patent Document 1 discloses an electrode structure of semiconductor device suitable for integration into a printed wiring board. The electrodes of semiconductor device of Patent Document 1 includes Ni (nickel) layer and Au (gold) layer formed by the electroless plating method so as to coat the Al (aluminum) electrodes which are their surface electrodes, and Cu (copper) layer formed by the electroless plating method so as to further coat them. The problem of non-plating deposition in fine electrodes is cited as a problem in Patent Document 1.

SUMMARY

In regard to the plating of electrodes, Ni(nickel)/Pd(palladium)/Au(gold) (hereinafter referred to as Ni/Pd/Au) plating is known. In Ni/Pd/Au plating, Ni layer and Pd layer is formed using the electroless plating method. Thereafter, Au layer is formed by using a substitution type electroless plating method. However, when Ni/Pd/Au plating is applied to the power semiconductor element having the above electrodes, on some electrodes, Au layer may not be sufficiently deposited. In this case, an oxide film is formed on the surface of the plating layer, which adversely affects the wettability of solder or the like and the wire bonding property. In other words, it results in a decrease in connection reliability in the electrodes of the power semiconductor element.

Other objects and novel features will become apparent from the description of this specification and the accompanying drawings.

According to an embodiment, semiconductor device includes a first electrode, a second electrode electrically connected to the first electrode, a third electrode electrically connected to at least one of the first electrode and the second electrode, a first plating deposition portion formed on the first electrode, a second plating deposition portion formed on the second electrode and having an area smaller than the first plating deposition portion, a third plating deposition portion formed on the third electrode and having a area smaller than the first plating deposition portion and a periphery length longer than the periphery length of the second plating deposition portion.

According to one embodiment, it is possible to prevent the connection reliability at the electrodes of semiconductor device is reduced.

BRIEF DESCRIPTION OF THE DRAWINGS

FIG. 5 is a cross-sectional view of the semiconductor device in the process shown in FIG. 4E.

DETAILED DESCRIPTION

Study by the Inventor of the Present Invention

Before describing of the semiconductor device according to present embodiment, the content examined by the inventor of the present application will be described.

Figure 1:
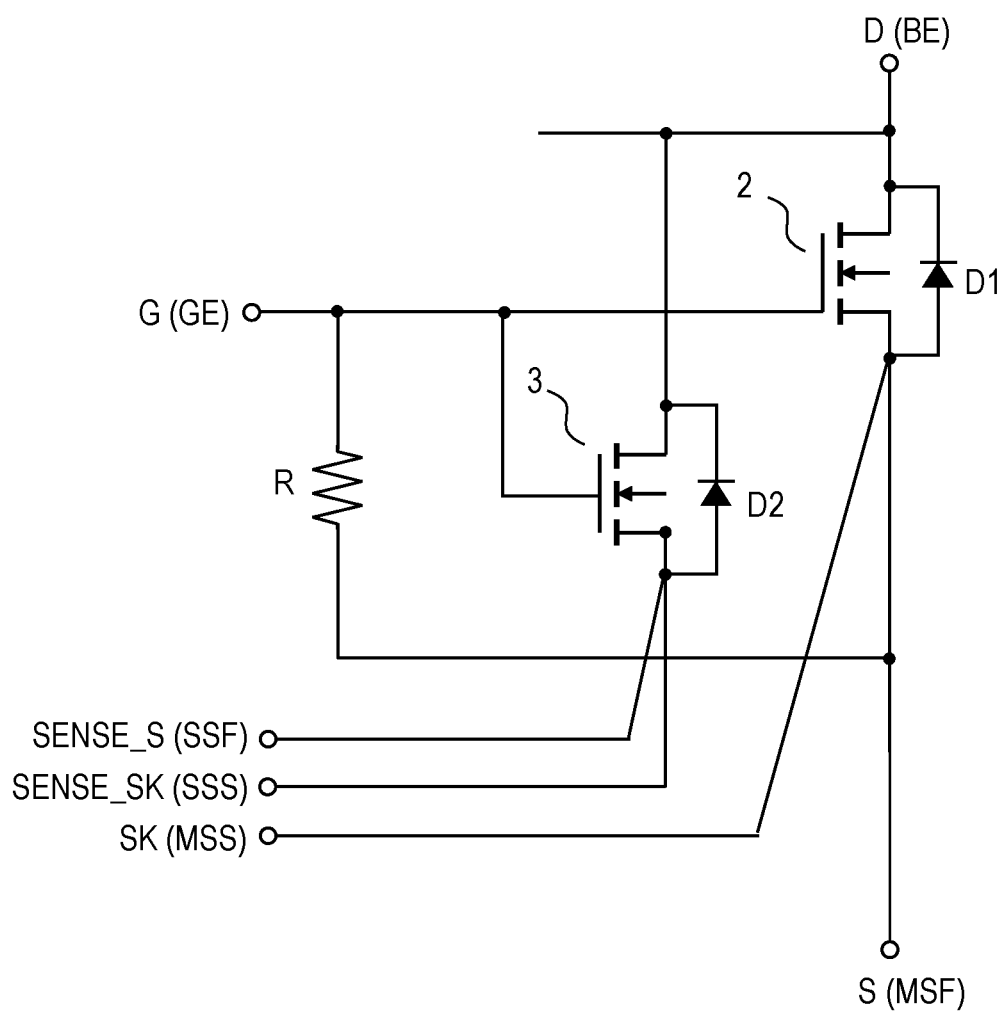
FIG. 1 is a schematic diagram illustrating an exemplary semiconductor device.

First, a semiconductor device 1 having a power semiconductor element will be described. FIG. 1 is a circuit diagram showing an example of the semiconductor device 1. The semiconductor device 1 has a power semiconductor element including a power MOSFET 2 and a sense MOSFET 3 for sensing the current flowing through the power MOSFET 2.

The power MOSFET 2 includes a source, the gate and the drain which are coupled to the source terminal S, the gate terminal G and the drain terminal D, respectively. The source of the power MOSFET 2 is also coupled to the source kelvin terminal SK. The gate terminal G is coupled to the source terminal S via a pull-down resistor R. The source terminal S, the gate terminal G, the drain terminal D and the source kelvin terminal SK, respectively, correspond to the main MOS source electrode MSF, the gate electrode GE, the back electrode BE and the main MOS source kelvin electrode MSS, to be described later.

The sense MOSFET 3 includes the source, the gate and the drain which are coupled to the source terminal SENSE_S for the sense MOSFET, the gate terminal G and the drain terminal D, respectively. The source of the sense MOSFET 3 is also coupled to the source kelvin terminal SENSE_SK for the sense MOSFET. The source terminal SENSE_S and the source kelvin terminal SENSE_SK for the sense MOSFET correspond to a sense MOS source electrode SSF and a sense MOS source kelvin electrode SSS, respectively, which will be described later.

In the power MOSFET 2, conduction between the source terminal S and the drain terminal D is controlled by the voltage of the gate terminal G, a current flow between the source terminal S and the drain terminal D. Therefore, the semiconductor device 1 is used as a switching device for flowing current.

Figure 2:
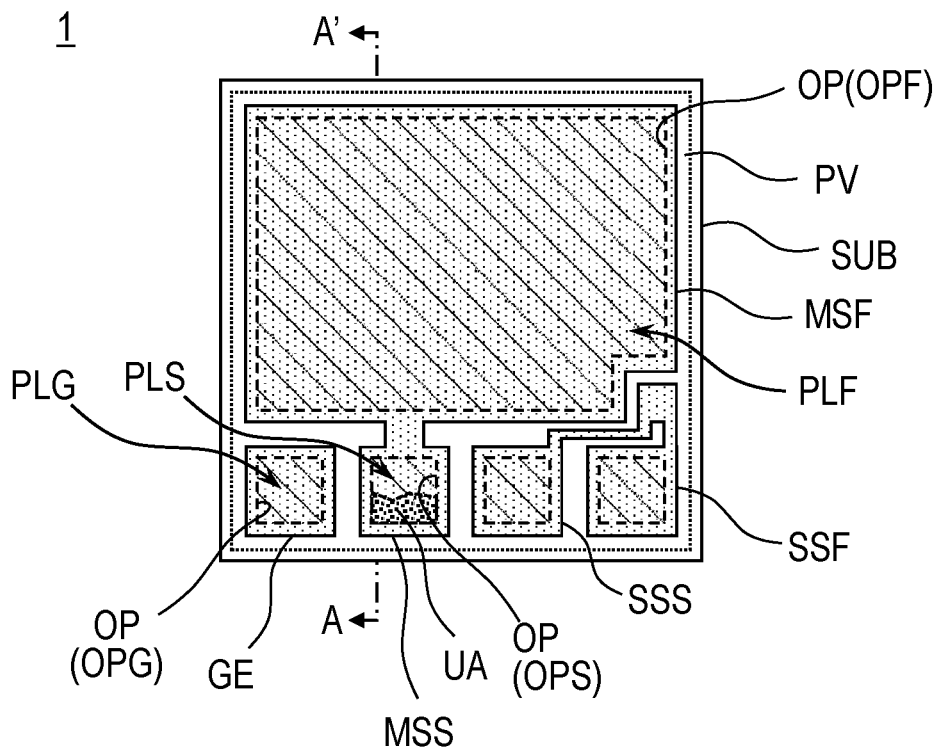
FIG. 2 is a plan view of semiconductor device on which the plated layers are formed.
Figure 3:
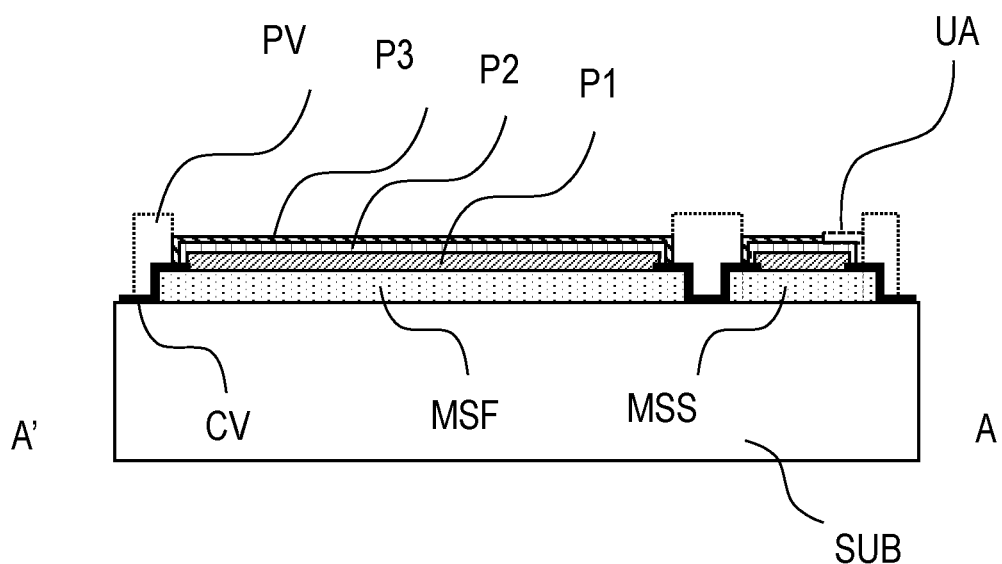
FIG. 3 is a cross-sectional view along A-A' line of semiconductor device shown in FIG. 2.

The electrodes corresponding to the terminals arranged on the main surface side of semiconductor device 1, Ni/Pd/Au plating is applied. FIG. 2 is a upper surface diagram of the semiconductor device 1 formed plating layer made of Ni/Pd/Au. FIG. 3 is A-A' cross-sectional view of the semiconductor device 1 shown in FIG. 2. The semiconductor device 1 includes the device structure of the power semiconductor element formed on the main surface side of semiconductor substrate SUB (element forming surface side). In FIG. 3, the illustration of the device structure of the power semiconductor element is omitted.

As shown in FIG. 2, the main MOS source electrode MSF, the gate electrode, the main MOS source kelvin electrode MSS, the sense MOS source electrode SSF and the sense MOS source kelvin electrode SSS are formed on the main surface side of the semiconductor device 1. The back electrode BE is formed on the back surface side of the semiconductor device 1. Therefore, the back electrode BE is not shown in FIG. 2. Each electrode formed on the main surface side is formed using the uppermost wiring layer of the semiconductor device 1. Further, a cover film CV and a passivation film PV are formed on each of the electrodes formed on the main surface side for surface protection. Openings OP are provided in the cover film CV and the passivation film PV so that a part of respective electrode is exposed. On the electrode exposed by the opening OP, the plating layer made of Ni layer P1, Pd layer P2, Au layer P3 is formed. Thereafter, the portion where the plating layer on the electrodes is formed is referred to as plating deposition portion. For example, a plating deposition portion PLF is formed on a part of the main MOS source electrode MSF exposed by the opening OP (OPS). A plating deposition portion PLS is formed on a part of the main MOS source kelvin electrode MSS exposed by the opening OP (OPS), the plating deposition portion PLG is formed on a part of the gate electrode GE exposed by the opening OP (OPG).

Next, Ni/Pd/Au plating process will be described. As described above, the Ni layer and the Pd layer are formed by using the electroless plating method. The Au layer is formed by using a substitution type electroless plating method.

FIGS. 4A to 4F illustrate, by way of example, the step of forming a plating layer on the main MOS source kelvin electrode MSS in semiconductor device 1.

Figure 4A:
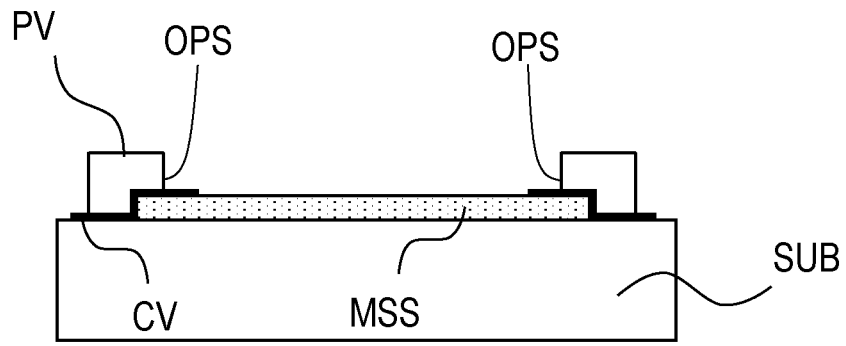
FIG. 4A to FIG. 4F are diagrams for explaining the steps of forming plating layers on semiconductor device.

FIG. 4A is the main MOS source kelvin electrode MSS prior to electroless plating. The part of the main MOS source kelvin electrode MSS is exposed by the opening OPS.

Figure 4B:
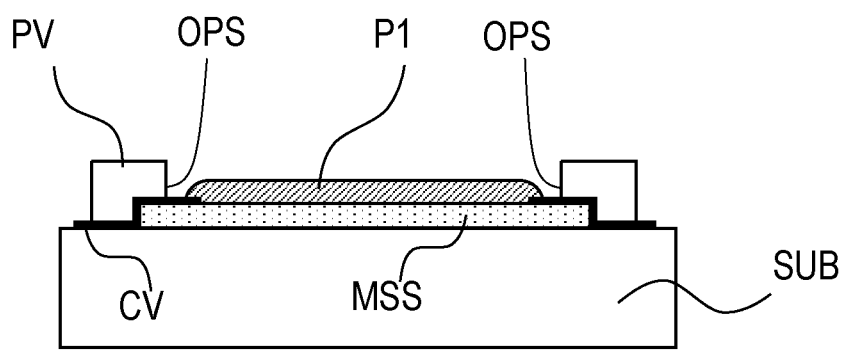
Figure 4C:
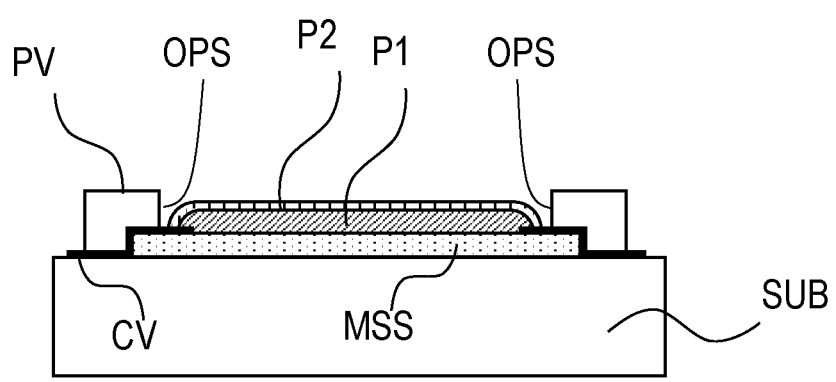

Subsequently, as shown in FIG. 4B, the Ni layer P1 is formed on the part of the main MOS source kelvin electrode MSS exposed by the opening OPS, and then, as shown in FIG. 4C, the Pd layer P2 is formed on the Ni layer P1.

Subsequently, in order to form the Au layer, the semiconductor device 1 is immersed in a plating solution. As shown in the drawing 4D, Ni in the Ni layer P1 dissolves and ionizes in the plating solution from the edge of the opening OPS, that is, the edge of the Pd layer P2, and electrons are emitted. The emitted electrons combine with Au ions in the plating solution to deposit Au, as shown in FIG. 4E. Finally, as shown in FIG. 4F, the Au layer P3 is formed so as to cover the Pd layer P2.

In this way, the plating layer made of Ni/Pd/Au is formed on the parts of electrodes exposed by the opening. However, in the plating deposition portion of a part of the electrodes of semiconductor device 1, there is a case a plating undeposited area UA where Au is not sufficiently deposited occurs.

As shown in FIG. 2, an opening having a size that reflects the area of the respective electrodes is provided on each electrode. The plating deposition portion of each electrode is provided so as to reflect the area of each opening. The area of the main MOS source kelvin electrode MSS is smaller than that of the main MOS source electrode MSF. Therefore, the plating deposition portion PLS formed in the opening of the main MOS source kelvin electrode MSS is smaller than the plating deposition portion PLF formed in the opening of the main MOS source electrode MSF. The undeposited area UA is generated in the plating deposition portion formed on the electrode having smaller area of the electrodes which are electrically coupled to each other. Specifically, as shown in FIG. 2, the main MOS source electrode MSF and the main MOS source kelvin electrode MSS are electrically coupled to each other, in the plating deposition portion PLS on the main MOS source kelvin electrode having a smaller electrode area, the plating undeposited area UA occurs. Incidentally, the plating undeposited area UA in the plating deposition portion PLS occurs significantly, when the area of the plating deposition portion PLS on the main MOS source kelvin electrode MSS is less than one hundredth of the area of the plating deposition portion PLF on the main MOS source electrode MSF.

Hereinafter, among the plating deposition portion formed on each of the two electrodes which are electrically coupled, the smaller the area of the plating deposition portion is referred to as a small area plating deposition portion, the larger the area of the plating deposition portion is referred to as a large area plating deposition portion. Here, the plating deposition portion PLS on the main MOS source kelvin electrode MSS corresponds to the small area plating deposition portion, the plating deposition portion PLF on the main MOS source electrode MSF corresponds to the large area plating deposition portion. Therefore, the plating undeposited area UA is generated in the small area plating deposition portion.

The occurrence of the plating undeposited area UA in the small area plating deposition portion studied by the present inventor will be described. The present inventor considers that the plating undeposited area UA in the small area plating deposition portion is generated by the following causes.

FIG. 5 is a cross-sectional view (cross-sectional view along A-A' line of FIG. 2) of the main MOS source electrode MSF and the main MOS source kelvin electrode MSS in the step of FIG. 4E.

Figure 4D:
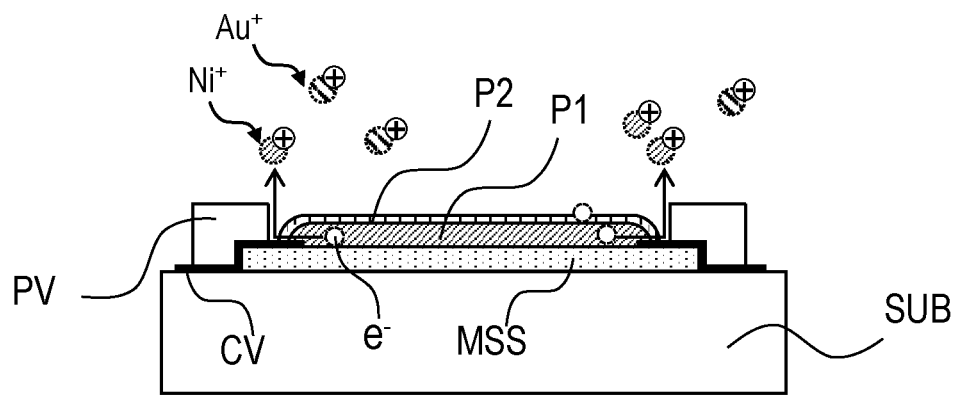
Figure 4E:
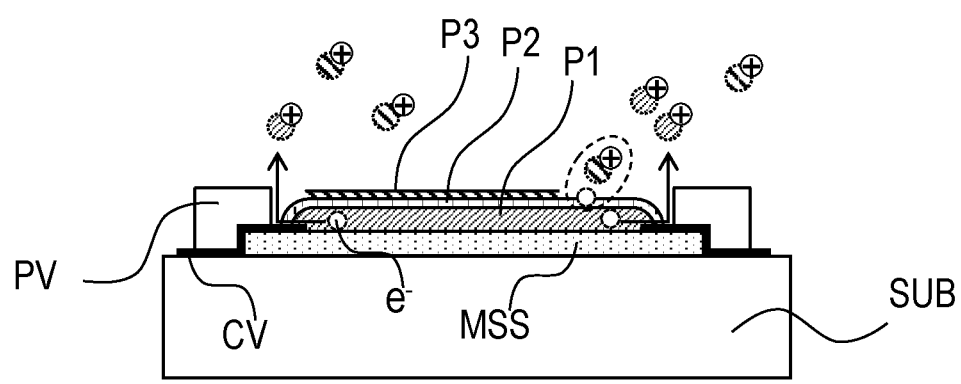
Figure 4F:
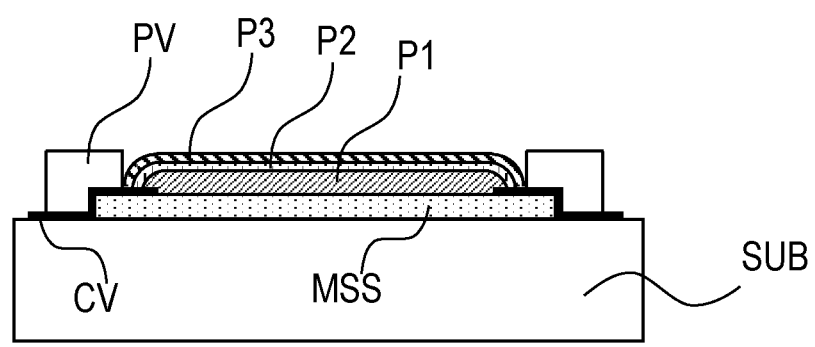

As described in the steps of FIG. 4D and FIG. 4E, the Ni of the Ni layer P1 is dissolved in the plating solution from the edge of the Pd layer P2 and ionized, whereby electrons are emitted. That is, electrons are emitted from the large area plating deposition portion and the small area plating deposition portion, respectively. However, since the large area plating deposition portion and the small area plating deposition portion are electrically coupled, electrons generated in the small area plating deposition portion are considered to be attracted to the large area plating deposition portion having large area in contact with Au ions in the plating solution. As a result, in the small area plating deposition portion, will be insufficient electrons necessary to sufficiently cover the surface, it is considered that the plating undeposited area occurs.

In FIG. 5, the main MOS source electrode MSF and the main MOS source kelvin electrode MSS has been described as an example, the area of the plating portion PLG on the gate electrode GE coupled to the main MOS source electrode MSF through the pull-down resistor R is also smaller than the area of the plating deposition portion PLF on the main MOS source electrode MSF. Therefore, as well as the plating deposition portion PLS on the main MOS source kelvin electrode MSS, in the plating deposition portion PLG on the gate electrode GE, there is a possibility that the plating undeposited area occurs. Although using the expression "undeposited" actually includes the case where a very thin Au plating layer is formed.

Therefore, in order not to generate a plating undeposited area in the small area plating deposition portion, it is necessary to ensure sufficient electrons to cover the surface in the small area plating deposition portion.

First Embodiment

Next, first embodiment will be described with reference to the drawings. In the specification and the drawings, the same or corresponding form elements are denoted by the same reference numerals, and a repetitive description thereof is omitted. In addition, for clarity of explanation, the drawings may schematically represent the width, thickness, shape, and the like of each portion as compared with actual embodiments, but are merely an example and do not limit the interpretation of the present invention. Also, at least some of the embodiments may be arbitrarily combined with each other.

Figure 6:
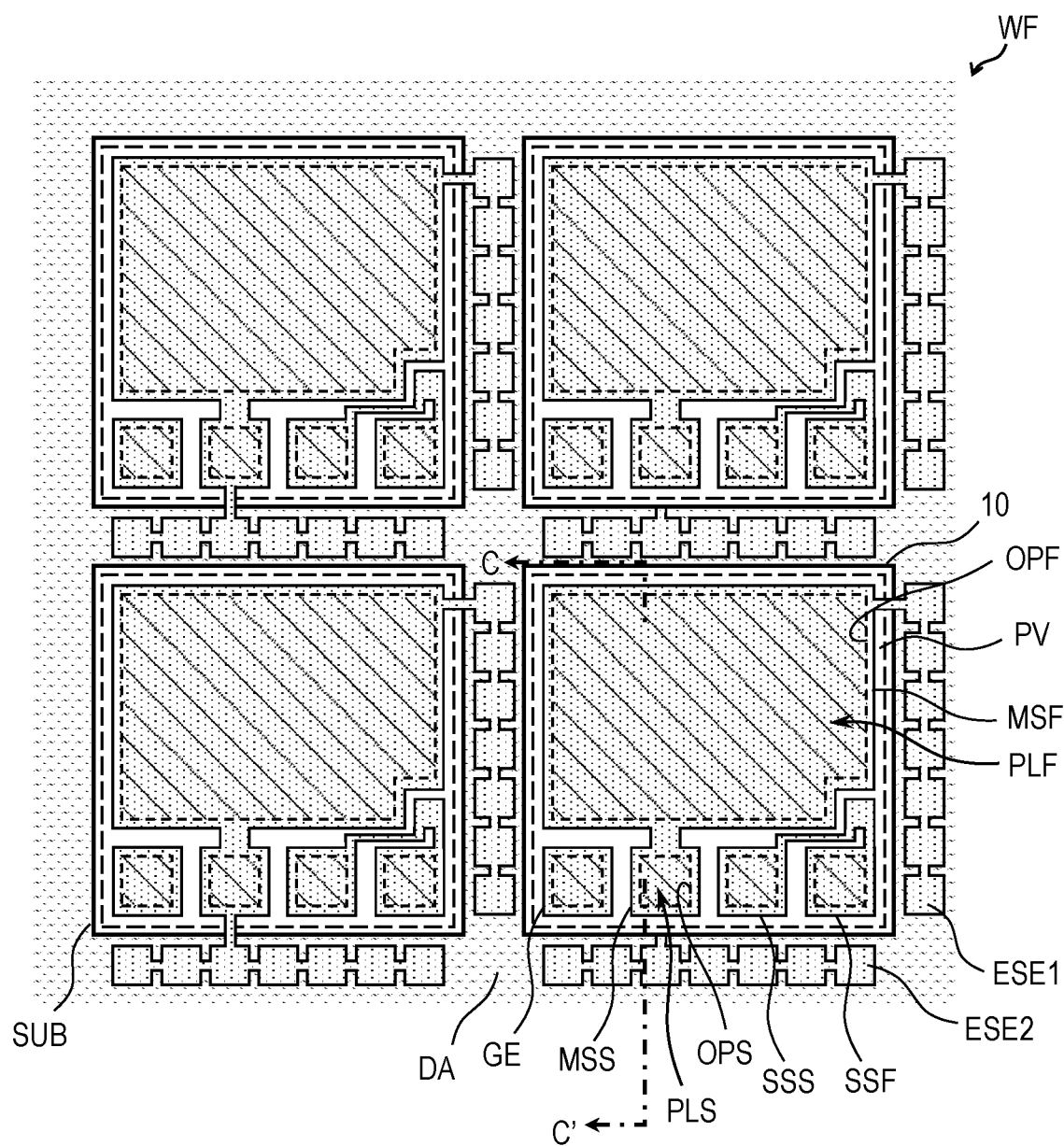
FIG. 6 is a plan view of a semiconductor device according to first embodiment.
Figure 7:
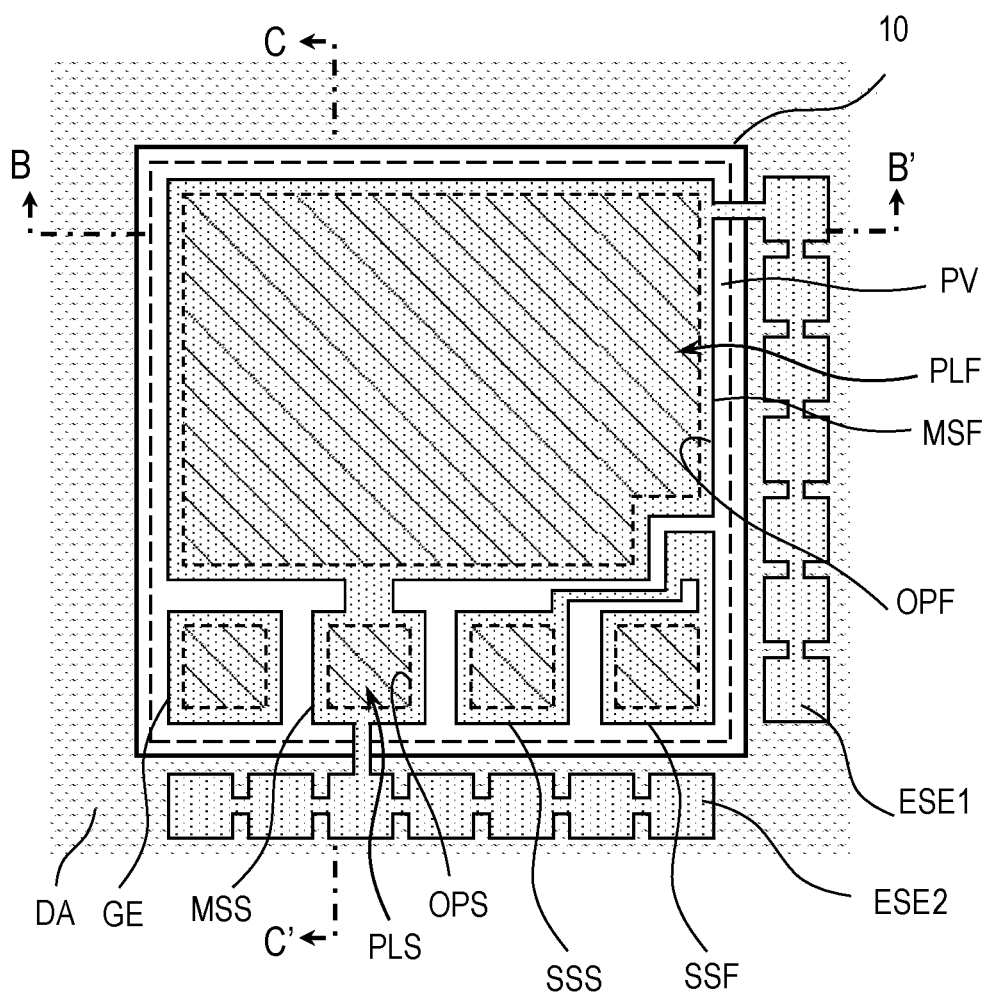
FIG. 7 is a diagram showing a chip region according to first embodiment.
Figure 8:
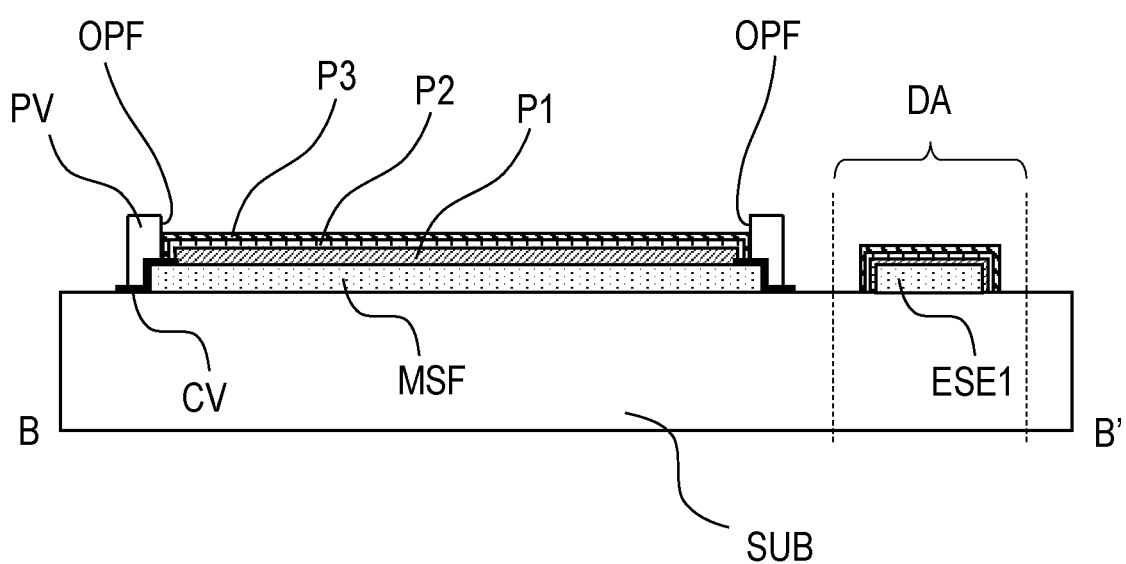
FIG. 8 is a cross-sectional view of the semiconductor device according to first embodiment.
Figure 9:
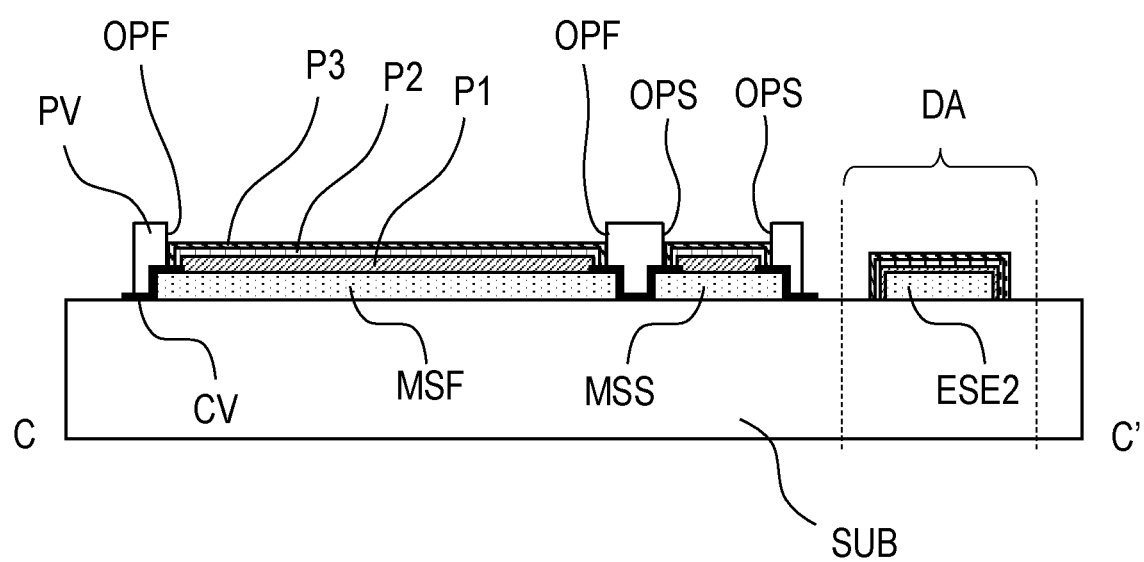
FIG. 9 is a cross-sectional view of the semiconductor device according to first embodiment.

Referring to FIG. 6, semiconductor device according to the first embodiment will be described. FIG. 6 is part of a plan view of the semiconductor wafer WF having a plurality of chip regions 10. FIG. 7 shows an enlarged view of the chip region 10. Further, FIG. 8 is a cross-sectional view along B-B' line of FIG. 7. FIG. 9 is a cross-sectional view along C-C' line of FIG. 7.

As shown in FIG. 6, the semiconductor wafer WF, in the plan view, includes a plurality of chip regions 10 and a dicing region DA. The dicing region DA is formed between the plurality of chip regions 10 so as to surround each of the plurality of chip regions 10. The semiconductor wafer WF is cut along the dicing region DA to form chips.

Each of the plurality of chip regions 10 has a power semiconductor element formed on the main surface side of semiconductor substrate SUB. In FIGS. 8 and 9, the structure of the power semiconductor element is omitted. Further, the circuit configuration of the power semiconductor element formed in the chip region 10 is the same as in FIG. 1, the description thereof will be omitted. On the main surface side of each chip area 10, the main MOS source electrode MSF, the gate electrode GE, the main MOS source kelvin electrode MSS, the sense MOS source electrode SSF, and the sense MOS source kelvin electrode SSS are arranged in a plan view, similar to semiconductor device 1 shown in FIG. 2. The main MOS source electrode MSF has a larger area than any of the electrodes formed on the main surface side. Further, the main MOS source electrode MSF and the main MOS source kelvin electrode MSS are electrically coupled via the wiring of the uppermost wiring layer.

In the cover film CV and the passivation film PV formed on the electrodes of the chip region 10, the openings are provided. Each of the openings has an area reflecting the area of the associated electrodes. On a part of electrode exposed by the opening, the plating layer is formed. Here, the openings formed on the main MOS source electrode MSF and on the main MOS source kelvin electrode MSS are referred to as opening OPF and opening OPS, respectively. Since the area of opening OPF and the area of the opening OPS are provided reflecting the area of the corresponding main MOS source electrode MSF and the main MOS source kelvin electrode MSS, respectively. Therefore, the plating layer forming region (plating deposition portion) PLF on the main MOS source electrode MSF is larger than the plating layer forming region (plating deposition portion) PLS on the main MOS source kelvin electrode MSS. For example, the area of the plating deposition portion PLF on the main MOS source electrode MSF is 100 times or more of the area of the plating deposition portion PLS on the main MOS source kelvin electrode MSS. In the same manner as described above, the plating deposition portion PLF of the main MOS source electrode MSF is also referred to as a large area plating deposition portion PLF. The plating deposition portion PLS of the main MOS source kelvin electrode MSS is also referred to as a small area plating deposition portion PLS.

The semiconductor wafer WF has an electron supplying electrode ESE1 electrically coupled to the main MOS source electrode MSF and smaller than the main MOS source electrode MSF. The semiconductor wafer WF also includes an electron supplying electrode ESE2 electrically coupled to the main MOS source kelvin electrode MSS and smaller than the main MOS source electrode MSF. For example, the electron supplying electrode ESE1 and ESE2 are coupled to the main MOS source electrode MSF and the main MOS source kelvin electrode MSS, respectively, through the wiring of the uppermost wiring layer. Hereinafter, when explaining without distinguishing the electron supplying electrode ESE1 and ESE2, simply referred to as the electron supplying electrode ESE. Incidentally, the main MOS source electrode MSF first electrode, the main MOS source kelvin electrode MSS second electrode, the electron supplying electrode ESE can be regarded as a third electrode.

Further, the electron supplying electrode ESE is not required bonding or clip connection, for example, as shown in FIG. 6, can be disposed in the dicing region DA. In this case, as shown in FIGS. 8 and 9, the electron supplying electrode ESE may not be covered with the cover film CV and the passivation film PV, unlike the electrodes of the chip region 10. However, if dicing is not affected, a part of the electron supplying electrode ESE may be covered with one or both of the cover film CV and the passivation film PV.

On the plating deposition portions of each electrode of the chip region 10 and the plating deposition portion of the electron supplying electrode ESE, the plating layer composed of the first plating layer P1, the second plating layer P2 and the third plating layer P3 is formed. The first plating layer P1, for example, a Ni layer having a thickness of about 1 μm to 5 μm, is formed by electroless plating. The second plating layer P2 is, for example, a Pd layer having a thickness of about 0.1 μm to 0.5 μm, is formed by electroless plating. Furthermore, the third plating layer, for example, an Au layer having a thickness of about 0.01 μm to 0.05 μm, is formed by substitution type electroless plating. As long as the material undergoes the same deposition process, the material for plating is not limited.

Figure 10:
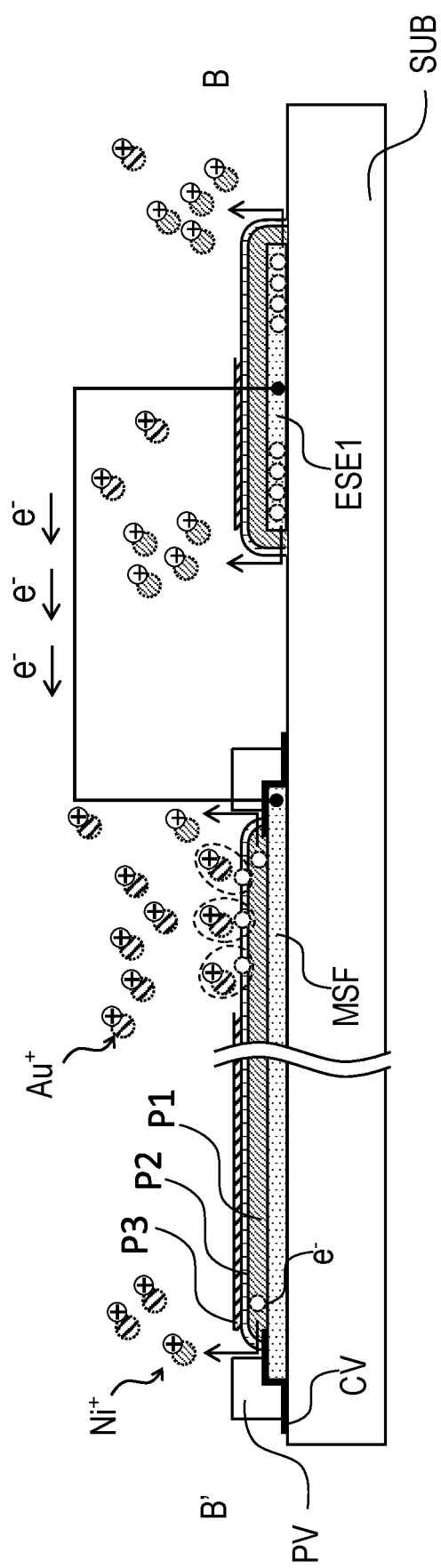
FIG. 10 is a schematic diagram of the cross section of the semiconductor device according to first embodiment in the plating layer forming step.
Figure 11:
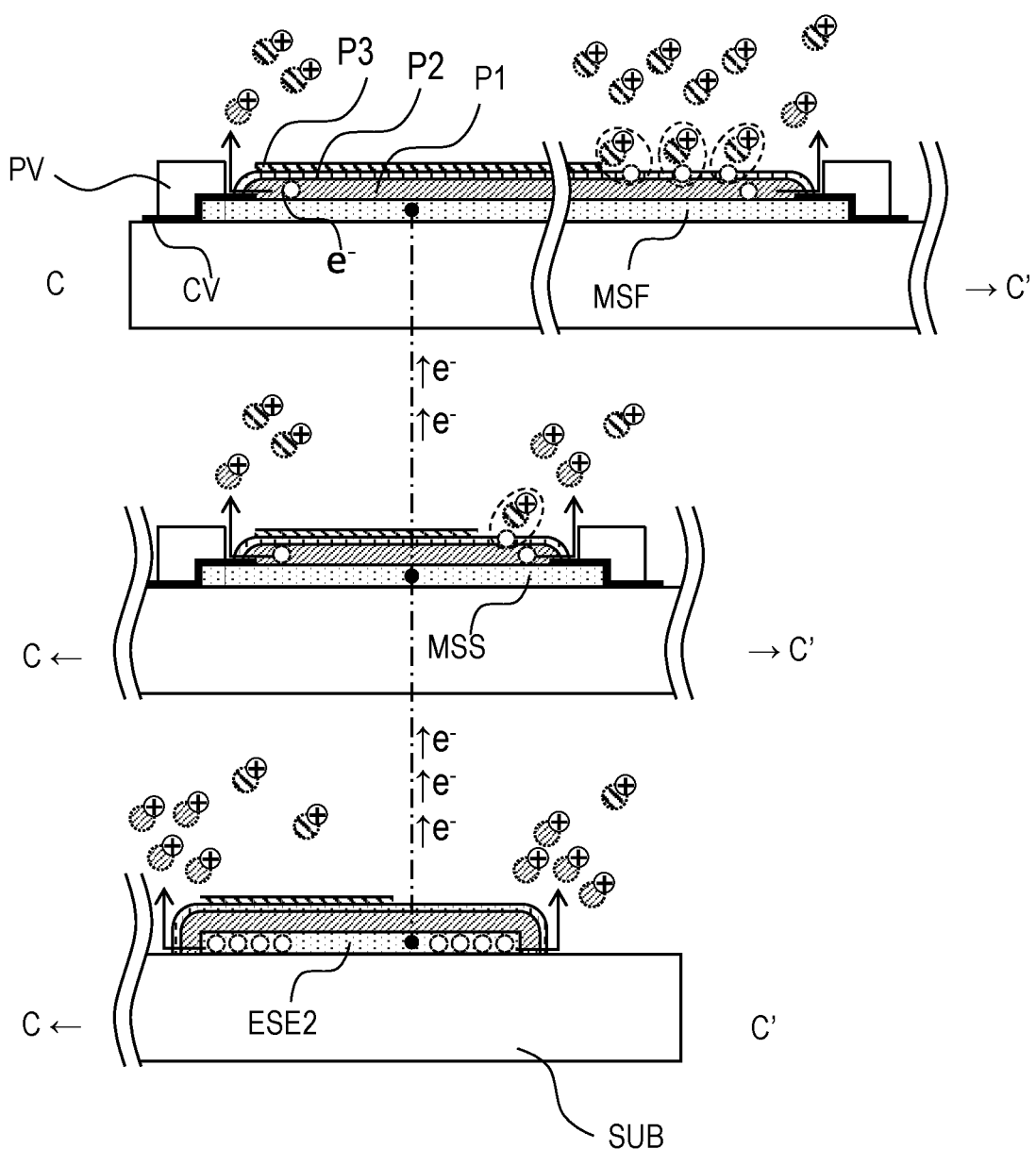
FIG. 11 is a schematic view of the cross section of the semiconductor device according to first embodiment in the plating layer forming step.

FIGS. 10 and 11 are schematic diagrams of cross-section views along B-B' line and C-C' line of the chip region 10 of FIG. 7 at the time of forming the third plating layer P3. Here, Ni/Pd/Au plating will be described as an example, the first plating layer is Ni layer P1, the second plating layer is Pd layer P2, the third plating layer is Au layer P3. In order to form the Au layer P3, the semiconductor wafer WF is immersed in a plating solution. Ni of the Ni layer P1 from the edge of the Pd layer P2 formed in the plating deposition portion PLF of the main MOS source electrode MSF is dissolved in the plating solution and is ionized, electrons are released. The emitted electrons combine with Au ions in the plating solution to form the Au layer P3 covering the surface of the Pd layer P2.

On the other hand, as shown in FIG. 10, Ni in the Ni layer P1 is dissolved in the plating solution and ionized from the edge of the Pd layer P2 formed on the electron supplying electrodes ESE1, and electrons are emitted. The emitted electrons combine with Au ions in the plating solution and deposit on the surfaces of the Pd layer P2 on the electron supplying electrode ESE1, thereby forming Au layer P3. As described above, since the area of the electron supplying electrode ESE1 is smaller than the main MOS source electrode MSF, the area of the plating deposition portion on the electron supply electrode ESE1 is smaller than the area of the plating deposition portion PLF on the main MOS source electrode MSF. Therefore, electrons emitted from the plating deposition portion of the electron supplying electrode ESE1 are attracted to the large area plating deposition portion PLF having large area in contact with Au ions in the plating solution. That is, the plating deposition portion on the electron supplying electrode ESE1 can be regarded as an electron supply source to the large area plating deposition portion PLF.

Further, as shown in FIG. 11, Ni of the Ni layer P1 is dissolved in the plating solution and ionized from the edge of the Pd layer P2 formed on the electron supplying electrodes ESE2, and electrons are emitted. Electrons emitted by the plating deposition portion on the electron supplying electrode ESE2, via the main MOS source kelvin electrode MSS, is attracted to the large area plating deposition portion PLF which is electrically coupled to the electron supplying electrode ESE2. That is, the plating deposition portion on the electron supplying electrode ESE2 which is electrically coupled to the small area plating deposition portion PLS also can be regarded as an electron supply source to the large area plating deposition portion PLF.

It is considered that electrons generated in the small area plating deposition portion PLS are also attracted to the large area plating deposition portion PLF having a large area in contact with Au ions in the plating solution. However, not only not only electrons generated from the small area plating deposition portion PLS but also electrons generated in the plating deposition portion on the electron supplying electrode ESE electrically coupled to the small area plating deposition portion are supplied to the large area plating deposition portion PLF. Therefore, by sufficiently supplying electrons from the electron supplying electrode ESE to the large area plating deposition portion PLF, it is possible to suppress moving electrons from the small area plating deposition portion PLS. That is, an insufficiency of electrons in the small area plating deposition portion PLS can be suppressed. As a result, it is possible to reduce that the plating undeposited region is generated in the small area plating deposition portion PLS.

In order to sufficiently perform the electron supply to the large area plating deposition portion PLF, it is preferable that electrons generated in the plating deposition portion on the electron supplying electrode ESE is more than the electrons generated in the small area plating deposition portion PLS. That is, it is desirable that the electron supplying electrode ESE has a shape such that Ni of the Ni layer P1 is more dissolved from the edge of the Pd layer P2, in the plating deposition portion. Therefore, it is preferable that the periphery length of the plating deposition portion on the electron supplying electrode ESE is longer than the periphery length of the small area plating deposition portion PLS. For example, the electron supplying electrode ESE in present embodiment has a shape as intercoupling rectangular shapes with wires, as shown in FIGS. 6 and 7. In other words, the electron supplying electrode ESE has two opposing sides which have a convex-concave shape, respectively. That is, the electron supplying electrode ESE has a shape such that wide and narrow portions of intervals between the two opposing sides are alternately arranged. For example, the electron supplying electrode ESE has a shape such that a plurality of rectangular electrodes being 50 μm, which is thinner than the dicing blade, on each side are arranged at 60 μm intervals. The rectangular electrodes are coupled to each other via the wiring having a wiring width that can be stably patterned (e.g., 5 μm). Such a shape can increase the periphery length of the electron supplying electrode ESE than the periphery length of the main MOS source kelvin electrode MSS.

As described above, when the area of the large area plating deposition portion PLF is greater than 100 times or more than the area of the small area plating deposition portion PLS, the occurrence of the undeposited area in the small area plating deposition portion PLS becomes remarkable. Therefore, having such a plating deposition portion area ratio, and, when a plurality of electrodes are electrically coupled to each other is provided, the electron supplying electrode ESE is provided. Since the electron supplying electrode ESE can be regarded as the electron supply source to the large area plating deposition portion PLF when performing the substitution type electroless plating, it is possible to suppress moving electrons from the small area plating deposition portion PLS. Thus, it is possible to prevent the electron shortage in the small area plating deposition portion PLS. As a result, it is possible to prevent the plating undeposited area is generated in the small area plating deposition portion PLS.

In the above description, the electron supplying electrode ESE is coupled to both the main MOS source electrode MSF and the main MOS source kelvin electrode MSS, it may be either. In that case, the electron supplying electrode ESE is preferable directly coupled to the main MOS source electrode MSF in which is formed large area plating deposition portion. That is, it is preferable that the electron supplying electrode ESE is coupled to an electrode having a plating deposition portion having a larger area among a plurality of electrodes electrically coupled to each other.

In the above description, since the electron supplying electrode ESE is disposed in the dicing region DA, it is possible to avoid the chip area increase by providing the electron supplying electrode ESE.

Second Embodiment

Figure 12:
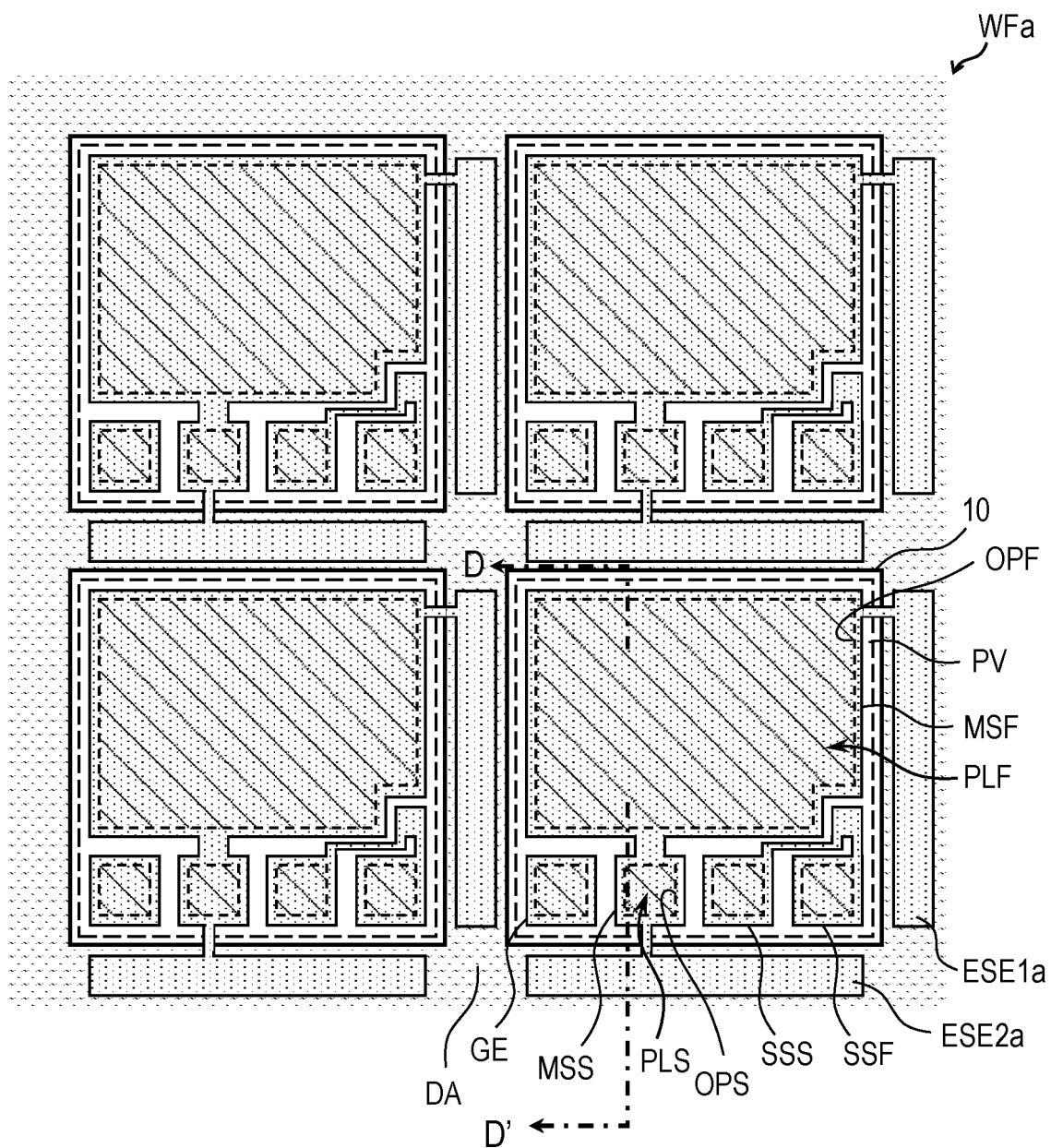
FIG. 12 is a plan view of a semiconductor device according to second embodiment.

Referring to FIG. 12, semiconductor device according to second embodiment will be described. FIG. 12 is a plan view of a part of a semiconducting wafer WFa in second embodiment. In second embodiment, an electron supplying electrode ESE1a and an electron supplying electrode ESE2a, which is another form of the electron supplying electrodes ESE1 and ESE2 according to first embodiment, will be described. Since configurations other than the electron supplying electrodes ESE1a and ESE2a may be similar to those shown in FIG. 6, their description will be omitted here. It should be noted that if electron supplying electrodes ESE1a and ESE2a are to be explained without distinguishing, they are simply referred to as electron supplying electrode ESEa.

As shown in FIG. 12, the electron supplying electrodes ESE1a and ESE2a differ from the electron supplying electrode ESE1 and ESE2 of first embodiment in that they have a rectangular configuration.

Figure 13:
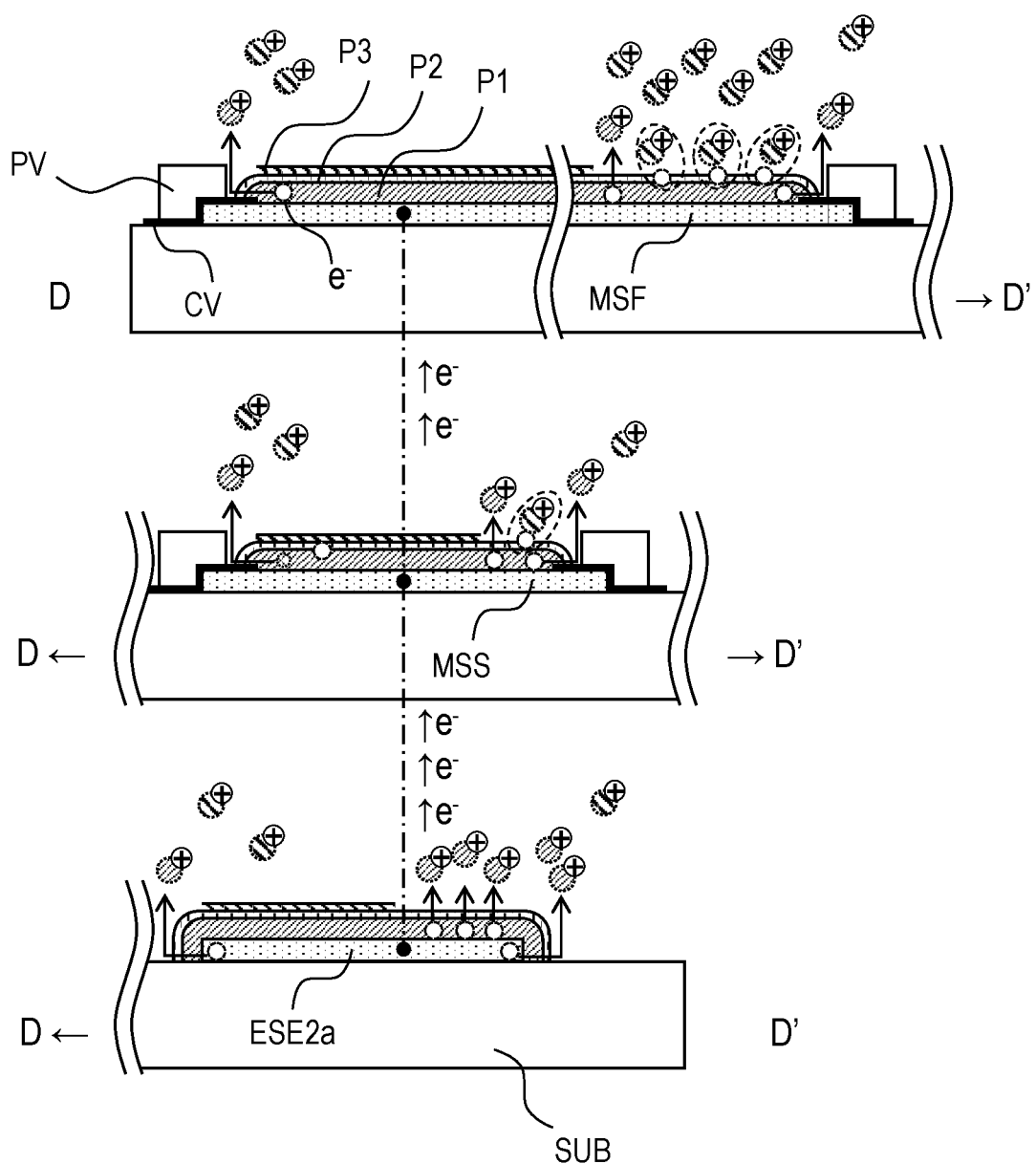
FIG. 13 is a cross-sectional view of the semiconductor device according to second embodiment in the plating layer forming step.

FIG. 13 shows a cross-sectional view along D-D' line of the semiconductor wafer WFa when the third plating layer P3 is formed on the semiconductor wafer WFa. In present embodiment as well, Ni/Pd/Au plating is exemplified in the same manner as in first embodiment. The first plating layer is Ni layer P1, the second plating layer is Pd layer P2, the third plating layer is Au layer P3.

For the semiconductor wafer WFa, the substitution type electroless plating is performed to form the Au layer P3. At this time, depending on the film quality of Pd layer P2 and the plating solution, as shown in FIG. 13, Ni of the Ni layer P1 may be more easily dissolved from the surface of the Pd layer P2 than from the edge of the Pd layer P2. In this case, the area of the plating deposition portion on the electron supplying electrode ESEa is preferably larger. As an example, in FIG. 12, an electron supplying electrode ESEa having a rectangular shape is shown. For example, the electron supplying electrode ESEa is narrow than the dicing blade, for example, it is desirable to arrange the electrode 50 μm wide along the dicing area DA. Further, the electron supplying electrode ESEa may be formed so as to have a larger area than the small area plating deposition portion PLS to sufficiently supply electrons to the large area plating deposition portion PLF. Further, the periphery length of the plating deposition portion on the electron supplying electrode ESEa having a rectangular shape may be longer than the periphery length of the small area plating deposition portion PLS. Thus, even when Ni of the Ni layer P1 is easily dissolved from the edge of the Pd layer P2, it is possible to efficiently supply electrons from the rectangular electron supplying electrode ESEa.

The electron supplying electrode ESEa in present embodiment is coupled to both the main MOS source electrode MSF and the main MOS source kelvin electrode MSS, similar to first embodiment, but may be either.

The electron supplying electrode ESEa according to second embodiment can be effectively shaped when electrons are easily emitted from the surfaces of the plating deposition portions. That is, the electron supplying electrode ESEa have a rectangular shape in which the electron is likely to occur, so that it is possible to generate more efficiently electrons in the electron supplying electrode ESEa. Electrons generated in the plating deposition portion on the electron supplying electrode ESEa are attracted to the large area plating deposition portion PLF to be electrically coupled to the electron supplying electrode ESEa. That is, the electron supplying electrode ESEa, in the plating step, is regarded as an electron source of the large area plating deposition portion PLF. As a result, it is possible to prevent the electron transfer and electron shortage of the small area plating deposition portion PLS, it is possible to suppress that the plating undeposited area occurs in the small area plating deposition portion PLS.

Third Embodiment

Figure 14:
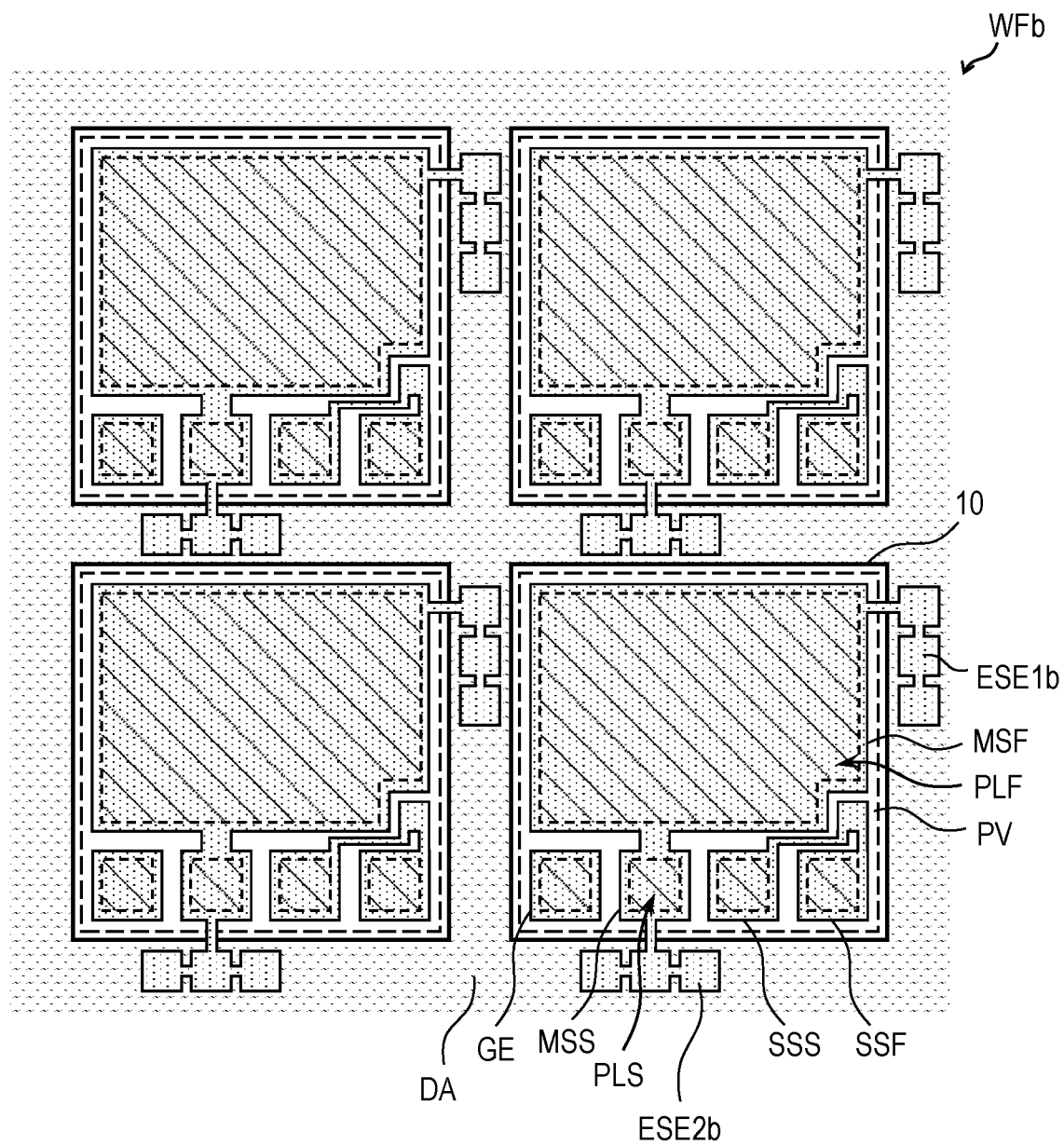
FIG. 14 is a plan view of a semiconductor device according to third embodiment.

Next, third embodiment will be described. In third embodiment, the electron supplying electrodes ESE1b and ESE2b, which is still another form of the electron supplying electrodes ESE1 and ESE2 according to first embodiment, will be described. FIG. 14 is a plan view of a part of the semiconductor wafer WFb in third embodiment. In third embodiment, since configurations other than the electron supplying electrodes ESE1b and ESE2b in the semiconductor wafer WFb are the same as those of the semiconductor wafer WF shown in FIG. 6, their descriptions will be omitted and denoted by the same reference numerals as FIG. 6. It should be noted that if the electron supplying electrodes ESE1b and ESE2b are not distinguished from each other, they may be simply referred to as the electron supplying electrode ESEb.

As shown in FIG. 14, each of the electron supplying electrodes ESE1b and ESE2b has a different shape from that of each of the electron supplying electrode ESE1 and ESE2 of first embodiment. The difference between the electron supplying electrode ESE and the electron supplying electrode ESEb is the area of the electrode. In the present third embodiment, the area of the electron supplying electrode ESEb is less than that of the main MOS source kelvin electrode MSS. That is, the plating deposition portion on the electron supplying electrode ESEb is formed to have the area smaller than the area of the plating deposition portion PLS of the main MOS source kelvin electrode MSS (small area plating deposition portion). In general, the plating layer, the smaller the area of the plating deposition portion, tends to be less likely to form. The fact that the plating layer is hardly formed means that the number of electrons combined with Au ions in the plating solution is small. Therefore, by reducing the area of the electron supplying electrode ESEb, electrons generated in the plating deposition portion on the electron supplying electrode ESEb can be suppressed to be used for plating its own surface. That is, electrons generated in the plating deposition portion of the electron supplying electrode ESEb are supplied to the large area plating deposition portion PLF efficiently. As a result, it is possible to suppress the electron transfer and electron shortage from the small area plating deposition portion PLS, it is possible to reduce occurrence of the plating undeposited area in the small area plating deposition portion PLS.

Incidentally, the electron supplying electrode ESEb shown in FIG. 14 has a suitable shape when Ni of the Ni layer is easily dissolved from the edge of the Pd layer P2. That is, as in first embodiment, the electron supplying electrode ESEb has two opposing sides each having a convex-concave shape. The electron supplying electrode ESEb has a shape such that wide and narrow portions of intervals between the two opposing sides are alternately arranged. However, from the viewpoint of increasing the electron supply from the electron supplying electrode ESEb, the periphery of the plating deposition portion on the electron supplying electrode ESEb has a longer shape than the periphery length of the small area plating deposition portion PLS. By such a shape, the periphery length of the electron supplying electrode ESEb is increased, electrons are likely to occur.

As described above, according to third embodiment, electrons generated in the plating deposition portion of the electron supplying electrode ESEb is prevented from using for forming the plating layer on the electron supplying electrode ESEb, can be supplied efficiently large area plating deposition portion.

Modified Example of Third Embodiment

Figure 15:
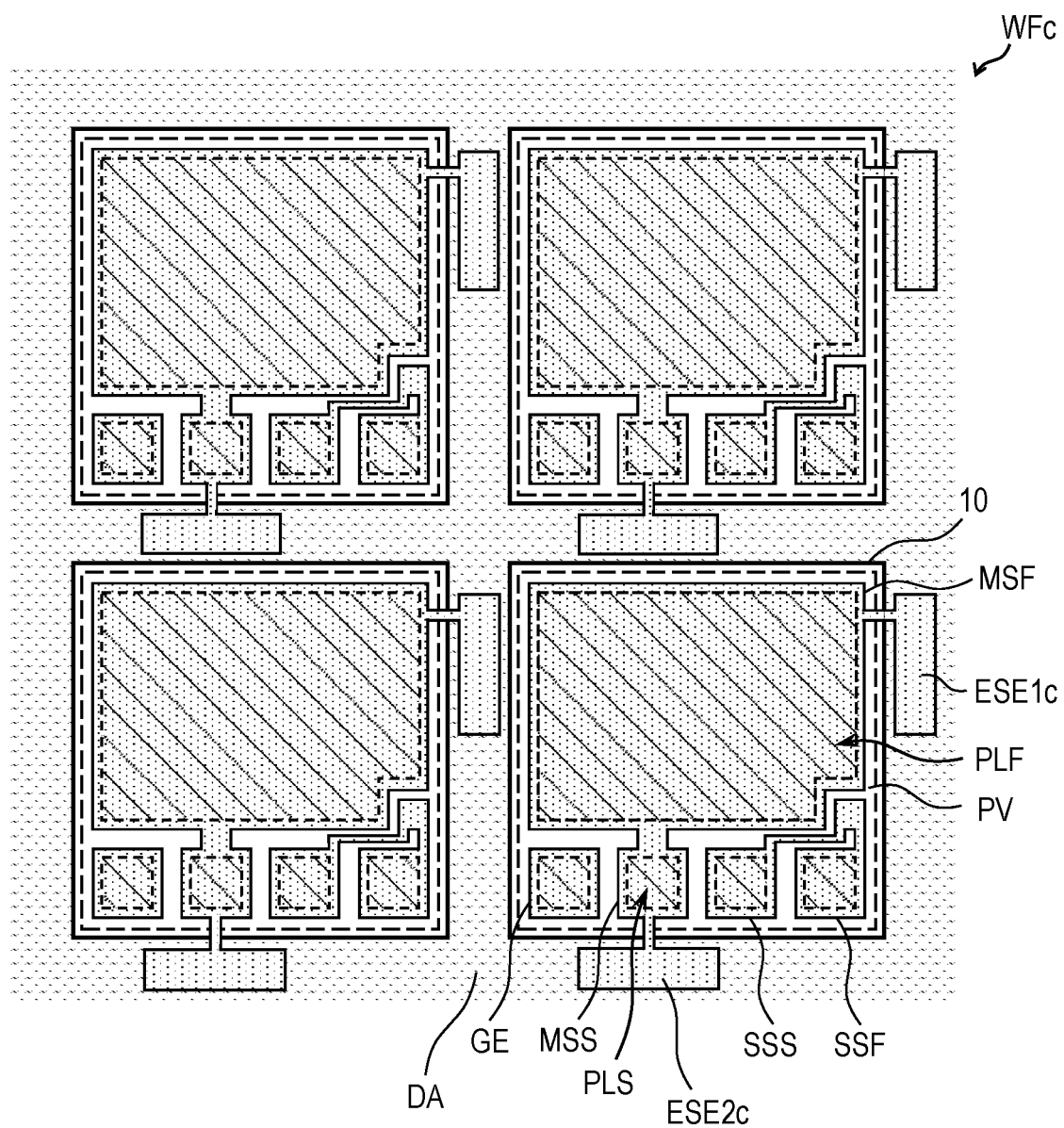
FIG. 15 is a plan view of the semiconductor device according to modified example of third embodiment.

Next, modified example of third embodiment will be described. FIG. 15 is a plan view of a part of a semiconductor wafer WFc in the present modified example. In the present modified example, configurations other than the electron supplying electrodes ESE1c and ESE2c in the semiconductor wafer WFc are the same as those of the semiconductor wafer WFb shown in FIG. 14, and their descriptions will be omitted. It should be noted that if the electron supplying electrodes ESE1c and ESE2c of electronically delivered electrodes are not distinguished from each other, they are simply referred to as the electron supplying electrode ESEc.

The electron supplying electrode ESEc in the present modified example, like third embodiment, has an area smaller than the area of the main MOS source kelvin electrode MSS. However, the electron supplying electrode ESEc in the present modified example has a shape suitable for Ni of the Ni layer is more easily dissolved from the surface of Pd layer P2 than the edge of Pd layer P2. Ni of the Ni layer, if more easily dissolved from the surface of the Pd layer P2 than the edge of the Pd layer P2, it is desirable that the area of the plating deposition portion is larger. Therefore, in the present modified example, the electron supplying electrode ESEc is formed so as to have a rectangular shape. Further, the periphery length of the plating deposition portion on the electron supplying electrode ESEc may have a longer than the periphery length of the small area plating deposition portion PLS. Thus, even when Ni in the Ni layer P1 is easily dissolved from the edge of the Pd layer P2, electrons can be efficiently supplied from the electron supplying electrode ESEc.

Therefore, substantially the same effects as those of third embodiment can be obtained in the present modified example.

Fourth Embodiment

Figure 16:
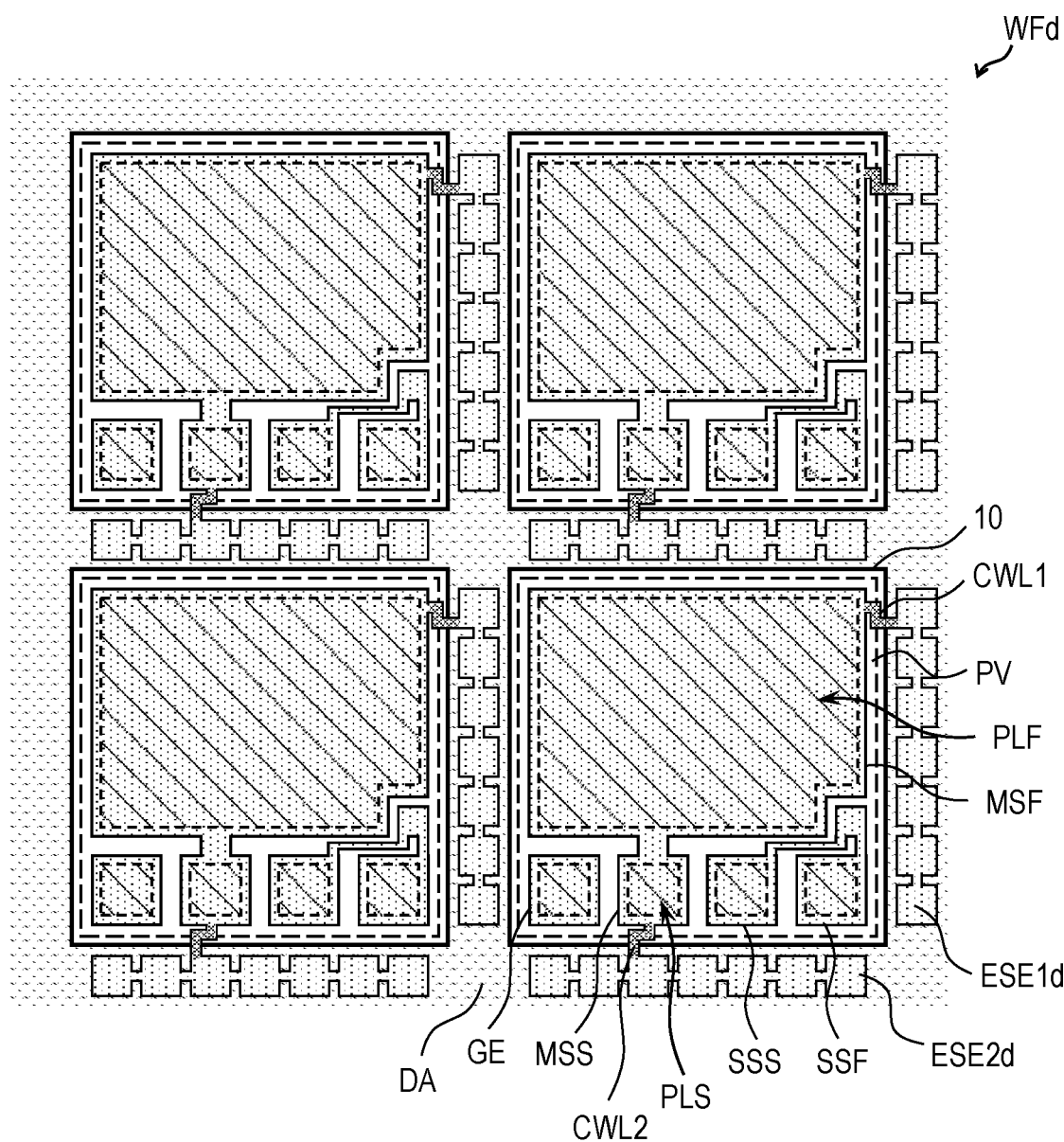
FIG. 16 is a plan view of a semiconductor device according to fourth embodiment.

FIG. 16 is a plan view of a part of a semiconductor wafer WFd according to fourth embodiment. In present embodiment, configurations other than the electron supplying electrodes ESE1d and ESE2d in the semiconductor wafer WFd are the same as those of the semiconductor wafer WF shown in FIG. 6, and therefore descriptions thereof will be omitted and denoted by the same reference numerals as FIG. 6. It should be noted that if the electron supplying electrode ESE1d and ESE2d are not distinguished from each other, they are simply referred to as the electron supplying electrode ESEd.

In the present fourth embodiment, the electron supplying electrodes ESE1d and ESE2d are disposed in the dicing region DA. The electron supplying electrode ESE1d is electrically coupled to the main MOS source electrode MSF via a connecting wiring CWL1. The electron supplying electrode ESE2d is also electrically coupled to the main MOS source kelvin electrode MSS via a connecting wiring CWL2. Since the shape of the electron supplying electrode ESEd may be any shape described in first embodiment to third embodiment, the descriptions thereof will be omitted. The connecting wirings CWL1 and CWL2 are wires of the uppermost wiring layer, respectively, in plan view, have at least one bent portion.

As in first embodiment, if the configuration is such that the connecting wires are exposed on the cutting surface of dicing, depending on the wafer process and package configuration, moisture may reach the chip edge, also slight peeling between the connecting wires and peripheral structures, for example the cover film, the passivation film or the mold of package, may occur in thermal stress or the like. In this case, the moisture resistance of the semiconductor chip may be deteriorated. However, as shown in FIG. 16, the connection wiring CWL1 and CWL2, in plan view, are formed to have a bent portion. Thus, the adhesion between the connection wiring and the peripheral structures is improved, it is possible to suppress deterioration of moisture resistance.

Therefore, it is possible to suppress a deterioration of moisture resistance of the semiconductor chip, which may occur when the electron supply electrode is provided in the dicing region.

Modified Example of Fourth Embodiment

Figure 17:
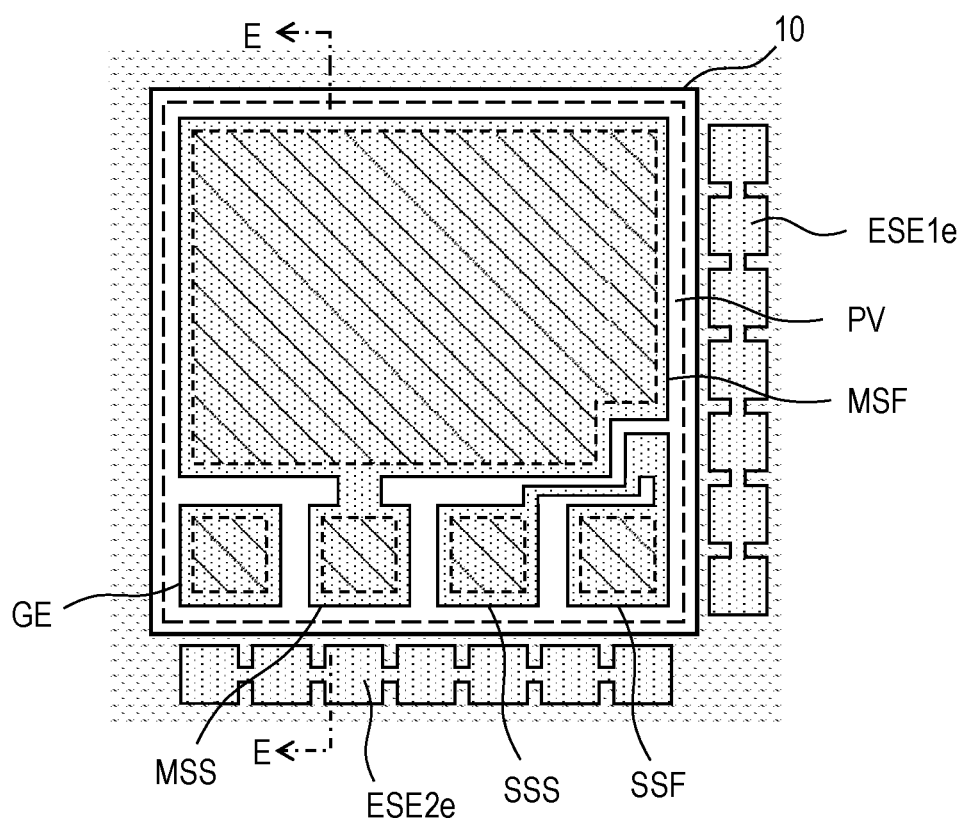
FIG. 17 is a plan view of the semiconductor device according to modified example of fourth embodiment.

Next, modified example of fourth embodiment will be described. FIG. 17 shows a plan view of a part of a semiconductor wafer in the present modified example, and FIG. 18 shows a cross-sectional view along line E-E' of FIG. 17.

Figure 18:
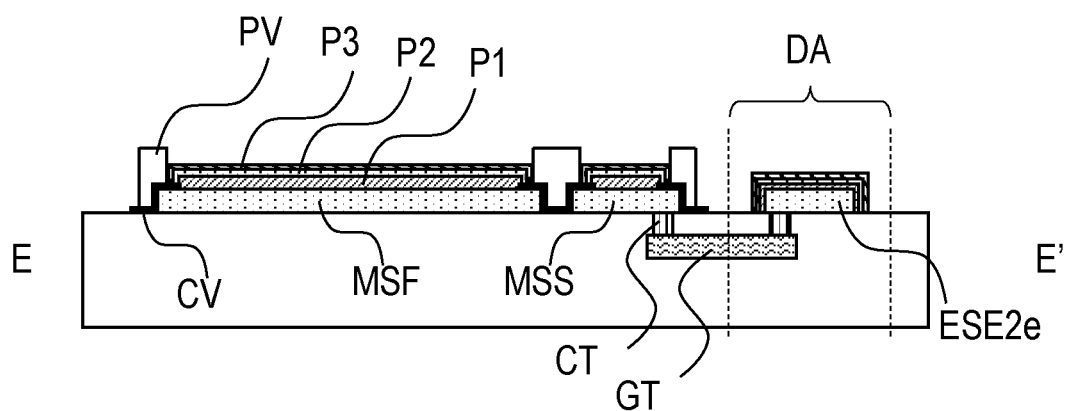
FIG. 18 is cross-sectional view of a semiconductor device related to modified example of fourth embodiment.

As shown in FIGS. 17 and 18, in the present modified example, the electron supplying electrode ESE1e and ESE2e may be coupled to the main MOS source electrode MSF and the main MOS source kelvin electrode MSS via contacts CT and conductor GT formed in the wiring layer below the wiring layer on which each electrode is formed.

By such a configuration, substantially the same effects as those of fourth embodiment can be obtained.

Fifth Embodiment

Figure 19:
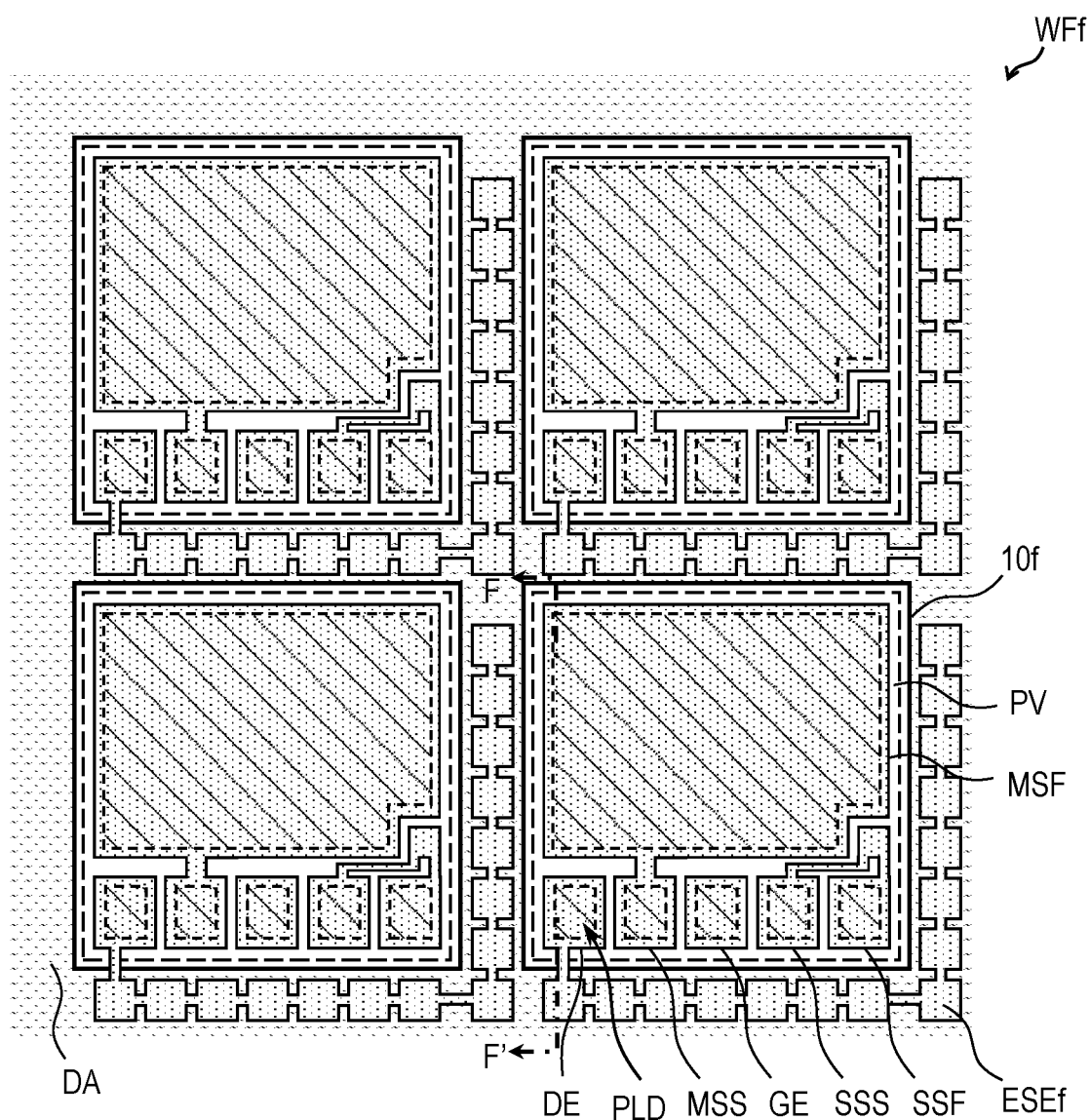
FIG. 19 is a plan view of a semiconductor device according to fifth embodiment.
Figure 20:
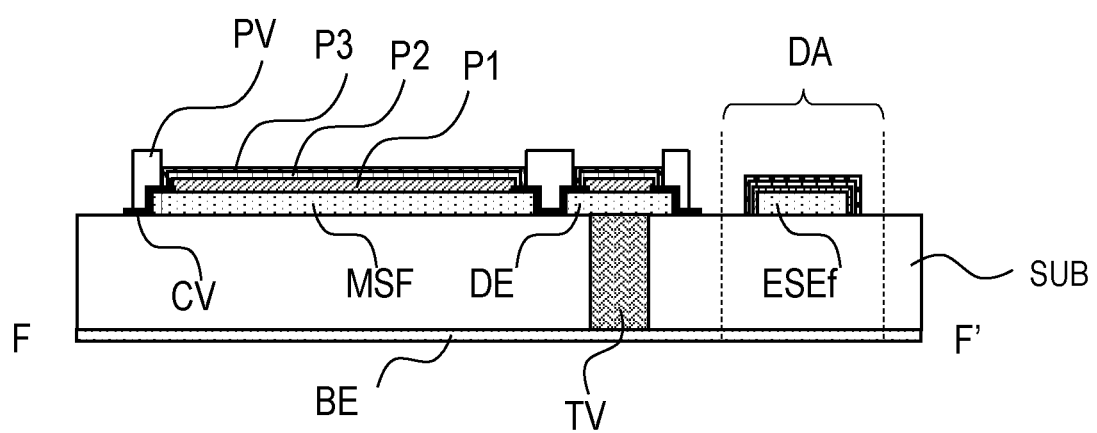
FIG. 20 shows cross-sectional view of the semiconductor device according to fifth embodiment.

Referring to FIGS. 19 and 20, the semiconductor device according to fifth embodiment will be described. FIG. 19 is a plan view of a part of a semiconductor wafer WFf according to fifth embodiment. FIG. 20 shows a cross-sectional view along F-F' line of FIG. 19.

The semiconductor wafer WFf according to fifth embodiment includes a plurality of chip regions 10f. The chip regions 10f include a power semiconductor element, respectively, as well as first embodiment. However, the fifth embodiment differs from first embodiment in that the drain electrode DE is provided on the main surface side of the chip area 10f. The drain electrode DE in present fifth embodiment, as shown in FIG. 20, is electrically coupled to the back electrode BE formed on the back surface of the semiconductor wafer WFf through the through electrode TV. The drain electrode DE is an electrode for monitoring the voltage of the drain terminal of the power MOSFET of the power semiconductor element. That is, the drain electrode DE is a kelvin electrode of the back electrode BE. In the chip region 10f, the configuration other than the drain electrode DE are the same as those of FIG. 6, therefore description thereof will be omitted and denoted by the same reference numerals as FIG. 6.

The drain electrode DE in present fifth embodiment, as shown in FIG. 20, is electrically coupled to the back electrode BE formed on the back surface of the semiconductor wafer WFf through the through electrode TV. The relationship between the plating deposition portion of the drain electrode DE and the plating deposition portion of the back electrode BE corresponds to the relationship between the plating deposition portion PLS of the main MOS source kelvin electrode MSS and the plating deposition portion PLF of the main MOS source electrode MSF in first embodiment. That is, the plating deposition portion PLD formed on the drain electrode DE corresponds to the small area plating deposition portion, the plating deposition portion formed on the back electrode BE corresponds to the large area plating deposition portion. Therefore, in the plating step, there is a possibility that the plating undeposited area is generated in the plating deposition portion PLD of the drain electrode DE.

Therefore, in fifth embodiment, on the main surface side of the chip area 10f, an electron supplying electrode ESEf which is electrically coupled to the drain electrode DE is provided. By forming the electron supplying electrode ESEf smaller than the back electrode BE, the electron supplying electrode ESEf, in the plating step, can functions as an electron supply source of large area plating deposition portion (plating deposition portion of the back electrode BE). As a result, it is possible to prevent the electron shortage due to moving electrons from the plating deposition portion PLD of the drain electrode DE. That is, it is possible to prevent the plating undeposited area in the plating deposition portion PLD of the drain electrode DE from generating.

Incidentally, the plating deposition portion formed on the back electrode BE shown in FIG. 20, in the plating step, not only refers to a portion where the conductive material formed on the Si substrate or the back surface is exposed. As plating does not deposit on the wafer back surface, in the step of plating to the wafer back surface being coated with an insulator such as a oxide film, a nitride film or a protective sheet, the edge of wafer and the portion of the back electrode that is partially exposed due to insufficient coverage are also considered to be the large area plating deposition portion.

Further, similarly to first embodiment, in the electron supplying electrode ESEf, when electrons are likely to be emitted from the edge of the plating deposition portion, it is desirable that the periphery length of the electron supplying electrode ESEf is long. In such cases, as in the case of first embodiment, for example, it is preferable that the electron supplying electrode ESEf has a shape in which wide and narrow portions of intervals between two opposing sides are alternately arranged. Such two opposing sides of the electron supplying electrode ESEf each has a convex-concave shape.

Sixth Embodiment

Figure 21:
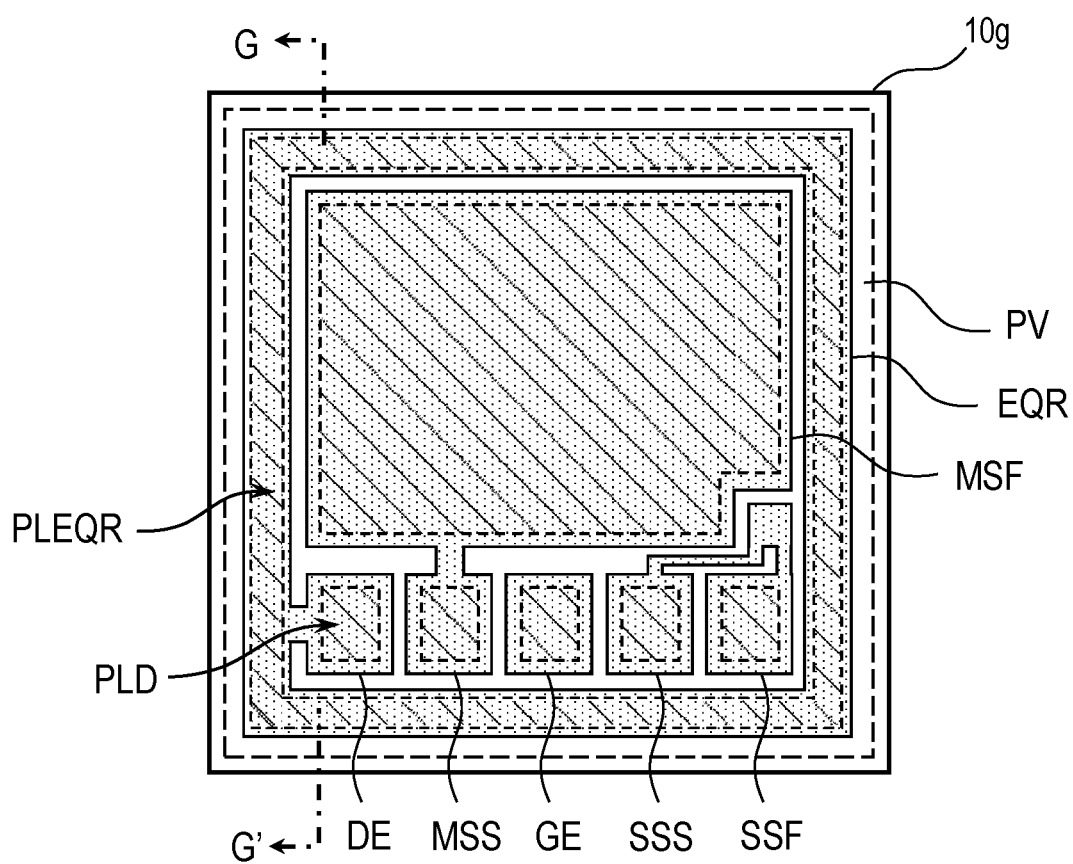
FIG. 21 is a plan view of a semiconductor device according to sixth embodiment.
Figure 22:
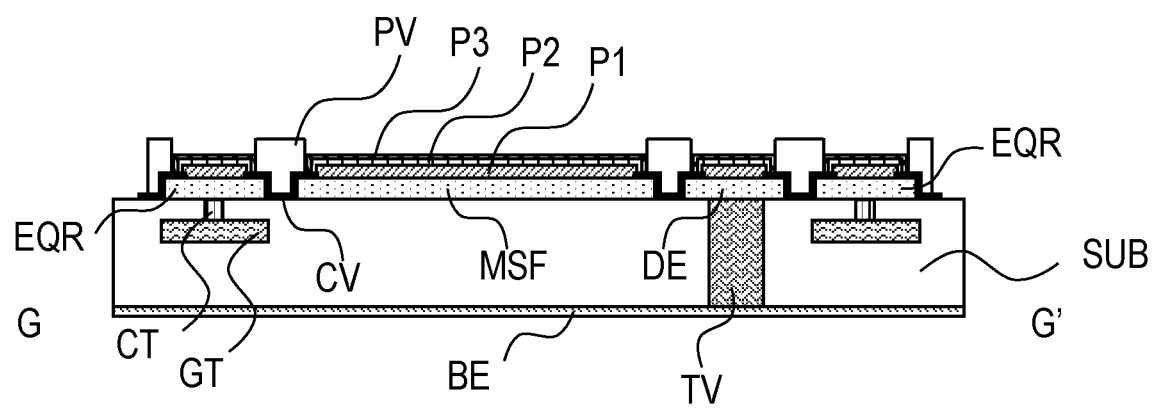
FIG. 22 is a cross-sectional view of the semiconductor device according to the sixth embodiment.

It will be described a semiconductor device according to the sixth embodiment with reference to FIGS. 21 and 22. FIG. 21 is a plan view of chip regions 10g formed on a semiconductor wafer in the sixth embodiment. FIG. 22 shows a cross-sectional view along G-G' line of FIG. 21.

The chip region 10g of FIG. 21, similarly to the chip region 10f in fifth embodiment, has a power semiconductor element. The drain electrode DE of the power semiconductor element is provided on the chip main surface side. Furthermore, the chip region 10g differs from the chip region 10f in fifth embodiment in that an equipotential ring electrode EQR is provided in place of the electron supplying electrode ESEf. The equipotential ring electrode EQR is provided to supply the potential of the drain to the chip outer periphery uniformly in a chip comprising a power semiconductor element. The power semiconductor element, it is possible to stabilize the withstand voltage by comprising an equipotential ring electrode EQR. The components other than the equipotential ring electrode EQR in the chip region 10g may be denoted by the same reference numerals shown in FIG. 19, and descriptions thereof are omitted.

As shown in FIGS. 21 and 22, the drain electrode DE in present embodiment not only is electrically coupled to the back electrode BE formed on the chip back surface through the through electrode TV, but also is electrically coupled to the equipotential ring electrode EQR. The area of the equipotential ring electrode EQR is smaller than the area of the back electrode BE.

The equipotential ring electrode EQR is usually covered with a cover film or a passivation film, and a plating deposition portion is not formed. However, in present embodiment, an opening is formed in the cover film or the passivating film covering the equipotential ring electrode EQR, and a plating deposition portion PLEQR is formed on the equipotential ring electrode EQR. By forming the plating deposition portion on the equipotential ring electrode EQR, the equipotential ring electrode EQR can be used as an electron supply electrode.

By forming the plating deposition portion PLEQR on the equipotential ring electrode EQR, in the substitution type electroless plating step of Ni/Pd/Au plating, electrons are also emitted from the plating deposition portion PLEQR of the equipotential ring electrode EQR. The emitted electrons, via the drain electrode DE which is electrically coupled to the equipotential ring electrode EQR, is attracted to the plating deposition portion of the back electrode BE having large area in contact with Au ions in the plating solution. That is, the equipotential ring electrode EQR, in the substitution type electroless plating step, may be regarded as an electronic supply source to the back electrode BE. As a result, the movement of electrons generated by the plating deposition portion PLD of the drain electrode DE is suppressed, it is possible to prevent the electron shortage in the plating deposition portion PLD of the drain electrode DE. Therefore, it is possible to prevent the plating undeposited region in the plating deposition portion PLD of the drain electrode DE from generating.

In the sixth embodiment, since the equipotential ring electrode EQR which also functions as an electronic supply source is not disposed in the dicing region, the humidity resistance of the chip and the dicing are not affected.

In present sixth embodiment, it is preferable that the equipotential ring electrode EQR is formed of wiring having widths of 5 μm or more which can be stably patterned, but the equipotential ring electrode EQR is not limited thereto. In present sixth embodiment, although the equipotential ring electrode EQR is formed in a linear shape, the equipotential ring electrode EQR is not limited to this shape. Similar to first embodiment, when electrons are easily emitted from the edge of the plating deposition portion, the plating deposition portion may have a shape of which the peripheral length may be larger.

Although the invention made by the present inventor has been specifically described based on the embodiment, the present invention is not limited to the embodiment described above, and it is needless to say that various modifications can be made without departing from the gist thereof.

For example, although the electron supplying electrodes according to first embodiment to fifth embodiment are formed in the dicing region DA, the electron supplying electrodes may be formed in the chip region without being limited thereto.

What is claimed is:

1. A semiconductor device comprising:
a first electrode;
a second electrode electrically coupled to the first electrode;
a third electrode electrically coupled to at least one of the first electrode and the second electrode;
a first plating deposition portion formed on the first electrode;
a second plating deposition portion formed on the second electrode and having an area smaller than an area of the first plating deposition portion; and
a third plating deposition portion formed on the third electrode and having an area smaller than the area of the first plating deposition portion,
wherein a periphery length of the third plating deposition portion is longer than a periphery length of the second plating deposition portion, and
wherein the third electrode is arranged in a dicing region.

2. The semiconductor device according to claim 1, comprising a power semiconductor element having a power MOSFET,
wherein the first electrode comprises a source electrode of the power MOSFET, and
wherein the second electrode comprises a source kelvin electrode of the power MOSFET.

3. The semiconductor device according to claim 1, wherein in the first, the second and the third plating deposition portion, a plating layer comprising Ni(nickel), Pd(palladium) and Au(gold) is formed.

4. The semiconductor device according to claim 1,
wherein the third electrode includes a first side and a second side opposing to each other, and
wherein each of the first side and the second side has a convex-concave shape.

5. The semiconductor device according to claim 4, wherein the third electrode includes wide and narrow portions of intervals between the first side and the second side alternately arranged.

6. The semiconductor device according to claim 1, wherein the area of the third plating deposition portion is smaller than the area of the second plating deposition portion.

7. The semiconductor device according to claim 1, further comprising:
a connection pattern coupled to at least one of the first electrode and the second electrode,
wherein the connection pattern includes a bending portion.

8. The semiconductor device according to claim 7, wherein the connection pattern is formed in the same wiring layer as the first electrode to the third electrode.

9. The semiconductor device according to claim 7, wherein the connection pattern is formed in a layer different from the first electrode to the third electrode.

10. The semiconductor device according to claim 1, wherein the area of the first plating deposition portion is more than 100 times the area of the second plating deposition portion.

11. The semiconductor device according to claim 1, comprising a power semiconductor element having a power MOSFET,
wherein the first electrode is a back electrode formed on a back side of the semiconductor device, and
wherein the second electrode is a kelvin electrode for the back electrode.

12. The semiconductor device according to claim 1, wherein the third electrode is not bonded or is not coupled to a clip.

13. A semiconductor device comprising:
a first electrode;
a second electrode electrically coupled to the first electrode;
a third electrode electrically coupled to at least one of the first electrode and the second electrode and arranged in a dicing region;
a first plating deposition portion formed on the first electrode;
a second plating deposition portion formed on the second electrode and having an area smaller than an area of the first plating deposition portion; and
a third plating deposition portion formed on the third electrode and having an area smaller than the area of the first plating deposition portion.

14. A semiconductor device comprising:
a first electrode;
a second electrode electrically coupled to the first electrode;
a third electrode electrically coupled to at least one of the first electrode and the second electrode;
a first plating deposition portion formed on the first electrode;
a second plating deposition portion formed on the second electrode and having an area smaller than an area of the first plating deposition portion; and
a third plating deposition portion formed on the third electrode and having an area smaller than the area of the first plating deposition portion,
wherein a periphery length of the third plating deposition portion is longer than a periphery length of the second plating deposition portion,
wherein the third electrode includes a first side and a second side opposing to each other,
wherein each of the first side and the second side has a convex-concave shape, and
wherein the third electrode includes wide and narrow portions of intervals between the first side and the second side alternately arranged.

* * * * *